US008583290B2

(12) United States Patent
Campbell et al.

(10) Patent No.: US 8,583,290 B2
(45) Date of Patent: Nov. 12, 2013

(54) COOLING SYSTEM AND METHOD MINIMIZING POWER CONSUMPTION IN COOLING LIQUID-COOLED ELECTRONICS RACKS

(75) Inventors: Levi A. Campbell, Poughkeepsie, NY (US); Richard C. Chu, Poughkeepsie, NY (US); Michael J. Ellsworth, Jr., Poughkeepsie, NY (US); Madhusudan K. Iyengar, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 139 days.

(21) Appl. No.: 12/556,066

(22) Filed: Sep. 9, 2009

(65) Prior Publication Data

US 2011/0060470 A1    Mar. 10, 2011

(51) Int. Cl.
*G06F 1/32* (2006.01)
*G05D 7/06* (2006.01)
*G05D 23/19* (2006.01)

(52) U.S. Cl.
USPC ............................ 700/282; 700/300; 700/295

(58) Field of Classification Search
None
See application file for complete search history.

(56) References Cited

U.S. PATENT DOCUMENTS

| | | |
|---|---|---|
| 3,578,014 A | 5/1971 | Gachot |
| 3,836,786 A | 9/1974 | Lowther |
| 4,325,296 A | 4/1982 | Ukai et al. |
| 4,430,866 A | 2/1984 | Willitts |
| 5,116,207 A | 5/1992 | Doolittle et al. |
| 5,491,649 A * | 2/1996 | Friday et al. .................. 700/276 |
| 5,634,350 A | 6/1997 | De Medio |
| 5,782,101 A | 7/1998 | Dennis |
| 5,829,264 A | 11/1998 | Ishigaki et al. |
| 5,859,885 A | 1/1999 | Rusnica et al. |
| 5,937,661 A | 8/1999 | Kishimoto et al. |
| 6,212,895 B1 | 4/2001 | Richardson |

(Continued)

OTHER PUBLICATIONS

Thirakomen, "Stabilitizing Chilled Water Distribution", ASHRAE Thailand Chapter Journal 2007-2008, v. 2, "http://www.ashraethailand.org/download/ashraethailand_org/journal_2007-2008_40_stabilizing%20chilled%20water%20distribution.pdf", pp. 27-31.*

(Continued)

*Primary Examiner* — Kakali Chaki
*Assistant Examiner* — Walter Hanchak
(74) *Attorney, Agent, or Firm* — Dennis Jung, Esq.; Kevin P. Radigan, Esq.; Reslin Rothenberg Farley & Mesiti P.C.

(57) ABSTRACT

A cooling system and method are provided for facilitating cooling of a liquid-cooled electronics rack. The cooling system includes a coolant flow controller, a modular cooling unit and a pressure controller. The flow controller is associated with a respective electronics rack and controls flow of coolant through that electronics rack based on its changing cooling requirements. The cooling unit includes an adjustable coolant pump for facilitating supply of coolant to the rack. The pressure controller is associated with the cooling unit for controlling pressure of coolant at an output of the cooling unit via control of pump speed of the pump. Responsive to adjusting coolant flow through the electronics rack, the pressure controller automatically adjusts pump speed of the adjustable pump to maintain pressure about a constant coolant pressure set point at an output of the cooling unit, thereby conserving power while still cooling the liquid-cooled electronics rack.

22 Claims, 15 Drawing Sheets

(56) References Cited

U.S. PATENT DOCUMENTS

| | | | |
|---|---|---|---|
| 6,574,104 B2 | 6/2003 | Patel et al. | |
| 6,866,092 B1 | 3/2005 | Molivadas | |
| 6,973,793 B2 | 12/2005 | Douglas et al. | |
| 7,012,807 B2 | 3/2006 | Chu et al. | |
| 7,032,611 B1 | 4/2006 | Sheng | |
| 7,088,585 B2 | 8/2006 | Chu et al. | |
| 7,096,679 B2 | 8/2006 | Manole | |
| 7,106,590 B2 | 9/2006 | Chu et al. | |
| 7,143,605 B2 | 12/2006 | Rohrer et al. | |
| 7,191,954 B2 | 3/2007 | Kline | |
| 7,222,502 B2 | 5/2007 | Kobayashi et al. | |
| 7,309,209 B2 | 12/2007 | Amiot et al. | |
| 7,315,448 B1* | 1/2008 | Bash et al. | 361/701 |
| 7,349,213 B2 | 3/2008 | Campbell et al. | |
| 7,365,973 B2 | 4/2008 | Rasmussen et al. | |
| 7,385,810 B2 | 6/2008 | Chu et al. | |
| 7,392,823 B2 | 7/2008 | Dong et al. | |
| 7,415,835 B2 | 8/2008 | Cowans et al. | |
| 7,418,825 B1* | 9/2008 | Bean, Jr. | 62/259.2 |
| 7,420,808 B2 | 9/2008 | Campbell et al. | |
| 7,477,514 B2 | 1/2009 | Campbell et al. | |
| 7,531,142 B2 | 5/2009 | Huziwara et al. | |
| 7,559,207 B2 | 7/2009 | Knight et al. | |
| 7,715,194 B2 | 5/2010 | Brewer et al. | |
| 7,810,679 B2 | 10/2010 | Wauters et al. | |
| 7,895,854 B2* | 3/2011 | Bash et al. | 62/259.2 |
| 7,903,409 B2* | 3/2011 | Patel et al. | 361/700 |
| 7,944,694 B2 | 5/2011 | Campbell et al. | |
| 7,961,475 B2 | 6/2011 | Campbell et al. | |
| 7,963,119 B2 | 6/2011 | Campbell et al. | |
| 8,018,718 B2 | 9/2011 | Goth et al. | |
| 8,018,720 B2 | 9/2011 | Campbell et al. | |
| 8,208,258 B2 | 6/2012 | Campbell et al. | |
| 2001/0042571 A1 | 11/2001 | Fang et al. | |
| 2002/0149909 A1 | 10/2002 | Konstad et al. | |
| 2003/0057546 A1 | 3/2003 | Memory et al. | |
| 2005/0115257 A1 | 6/2005 | Goth et al. | |
| 2005/0244280 A1 | 11/2005 | Malone et al. | |
| 2006/0126296 A1 | 6/2006 | Campbell et al. | |
| 2006/0180300 A1 | 8/2006 | Lenehan et al. | |
| 2007/0119570 A1* | 5/2007 | Kuo et al. | 165/80.4 |
| 2007/0213881 A1* | 9/2007 | Belady et al. | 700/300 |
| 2007/0297136 A1 | 12/2007 | Konshak | |
| 2008/0205003 A1 | 8/2008 | Belady | |
| 2009/0080173 A1 | 3/2009 | Schmidt et al. | |
| 2009/0126909 A1 | 5/2009 | Ellsworth, Jr. et al. | |
| 2009/0126910 A1 | 5/2009 | Campbell et al. | |
| 2009/0133866 A1 | 5/2009 | Campbell et al. | |
| 2010/0032142 A1* | 2/2010 | Copeland et al. | 165/104.33 |
| 2010/0263855 A1 | 10/2010 | Arimilli et al. | |
| 2011/0029152 A1* | 2/2011 | Patel et al. | 700/300 |
| 2011/0056225 A1 | 3/2011 | Campbell et al. | |
| 2011/0056674 A1 | 3/2011 | Campbell et al. | |
| 2011/0056675 A1 | 3/2011 | Barringer et al. | |
| 2011/0058637 A1 | 3/2011 | Campbell et al. | |

OTHER PUBLICATIONS

Campbell et al., Office Action for U.S. Appl. No. 12/556,053, filed Sep. 9, 2009 (U.S. Patent Publication No. 2011/0056674 A1), dated Dec. 21, 2011.

Barringer et al., Office Action for U.S. Appl. No. 13/447,457, filed Apr. 16, 2012 (U.S. Patent Publication No. 2012/0201005 A1), dated Apr. 15, 2013.

Campbell et al., Office Action for U.S. Appl. No. 12/556,019, filed Sep. 9, 2009 (U.S. Patent Publication No. 2011/0058637 A1), dated May 23, 2013 (pp. 1-17).

Campbell et al., Notice of Allowance for U.S. Appl. No. 12/556,031, filed Sep. 9, 2009 (U.S. Patent Publication No. 2011/0056225 A1), dated Jul. 24, 2012.

Campbell et al., Office Action for U.S. Appl. No. 12/556,019, filed Sep. 9, 2009 (U.S. Patent Publication No. 2011/0058637 A1), dated Nov. 2, 2012.

Campbell et al., "Condenser Structures with Fin Cavities Facilitating Vapor Condensation Cooling of Coolant", U.S. Appl. No. 12/491,287, filed Jun. 25, 2009.

Campbell et al., "Apparatus and Method for Facilitating Immersion-Cooling of an Electronic Subsystem", U.S. Appl. No. 12/256,618, filed Oct. 23, 2008.

Campbell et al., "Liquid Cooling Apparatus and Method for Cooling Blades of an Electronic System Chassis", U.S. Appl. No. 12/256,623, filed Oct. 23, 2008.

Zamanabadi et al., "Hybrid Control Challenges in Refrigeration Systems", Danfoss A/S, Denmark, Advanced Engineering—Refrigeration and Air Conditioning, EECI (2007).

* cited by examiner

COOLING SYSTEM AND METHOD MINIMIZING POWER CONSUMPTION IN COOLING LIQUID-COOLED ELECTRONICS RACKS

BACKGROUND

The present invention relates in general to systems and methods for facilitating parallel cooling of rack-mounted assemblages of individual electronics units, such as rack-mounted computer server units.

The power dissipation of integrated circuit chips, and the modules containing the chips, continues to increase in order to achieve increases in processor performance. This trend poses a cooling challenge at both module and system level. Increased airflow rates are needed to effectively cool high power modules and to limit the temperature of the air that is exhausted into the computer center.

In many large server applications, processors along with their associated electronics (e.g., memory, disk drives, power supplies, etc.) are packaged in removable drawer configurations stacked within a rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer by providing greater airflow, through the use of a more powerful air moving device or by increasing the rotational speed (i.e., RPMs) of an existing air moving device. However, this approach is becoming problematic at the rack level in the context of a computer installation (i.e., data center).

The sensible heat load carried by the air exiting the rack is stressing the availability of the room air-conditioning to effectively handle the load. This is especially true for large installations with "server farms" or large banks of computer racks close together. In such installations, liquid cooling (e.g., water cooling) is an attractive technology to manage the higher heat fluxes. The liquid absorbs the heat dissipated by the components/modules in an efficient manner. Typically, the heat is ultimately transferred from the liquid to an outside environment, whether air or liquid cooled.

BRIEF SUMMARY

In one aspect, the shortcomings of the prior art are overcome and additional advantages are provided through the provision of a cooling system for facilitating cooling of one or more liquid-cooled electronics systems, such as one or more liquid-cooled electronics racks. The cooling system includes at least one coolant flow controller associated with the at least one liquid-cooled electronics system to be cooled, at least one modular cooling unit for supplying system coolant to the at least one liquid-cooled electronics system to be cooled, and at least one pressure controller for controlling pressure of system coolant at the output of the at least one modular cooling unit. Each coolant flow controller adjusts flow of system coolant through a respective liquid-cooled electronics system based on changing cooling requirements of that liquid-cooled electronics system. Each modular cooling unit includes an adjustable coolant pump for facilitating supply of system coolant to the at least one liquid-cooled electronics system. The at least one pressure controller is associated with the at least one modular cooling unit for controlling pressure of system coolant at the output thereof via control of pump speed of the adjustable coolant pump(s). Responsive to an adjusting flow of system coolant through the at least one liquid-cooled electronics system by the at least one coolant flow controller, the at least one pressure controller automatically adjusts pump speed of the at least one adjustable coolant pump to maintain coolant pressure at the output of the at least one modular cooling unit within a range about a constant pressure set point, wherein a decrease in system coolant flow rate through the at least one liquid-cooled electronics system automatically results in the at least one pressure controller decreasing pump speed of the at least one adjustable coolant pump, thereby reducing power consumption of the at least one adjustable coolant pump in cooling the at least one liquid-cooled electronics system.

In another aspect, a data center is provided which includes a plurality of liquid-cooled electronics racks, and a cooling system for facilitating cooling of the liquid-cooled electronics racks. The cooling system includes a plurality of coolant flow controllers, a plurality of modular cooling units, and a plurality of pressure controllers. Each coolant flow controller is associated with a different liquid-cooled electronics rack for adjusting flow of system coolant therethrough based on changing cooling requirements of that liquid-cooled electronics rack. The plurality of modular cooling units facilitate supply of cooled system coolant to the plurality of liquid-cooled electronics racks, wherein each modular cooling unit includes an adjustable coolant pump for facilitating supply of the cooled system coolant. Each pressure controller is associated with a different modular cooling unit of the plurality of modular cooling units for controlling pressure of system coolant at an output of that modular cooling unit via control of pump speed of the adjustable coolant pump of the unit. Responsive to an adjusting flow of system coolant through the plurality of liquid-cooled electronics racks by the plurality of coolant flow controllers, the plurality of pressure controllers automatically adjust pump speed of the adjustable coolant pumps to maintain coolant pressure at the outputs of the plurality of modular cooling units within a range about a constant coolant pressure set point, and wherein a decrease in system coolant flow rate through the plurality of liquid-cooled electronics racks automatically results in the plurality of pressure controllers decreasing pump speed of the adjustable coolant pumps, thereby reducing overall power consumption of the plurality of adjustable coolant pumps in cooling the plurality of liquid-cooled electronics racks.

In a further aspect, a method of cooling at least one liquid-cooled electronics system is provided. The method includes: supplying system coolant from at least one modular cooling unit to at least one liquid-cooled electronics system to be cooled, each modular cooling unit comprising an adjustable coolant pump for facilitating supply of system coolant to the at least one liquid-cooled electronics system; dynamically adjusting flow of system coolant through the at least one liquid-cooled electronics system based on changing cooling requirements thereof, automatically adjusting system coolant pressure at the output of the at least one modular cooling unit by control of pump speed of the at least one adjustable coolant pump thereof, and wherein responsive to the dynamically adjusting flow of system coolant through the at least one liquid-cooled electronics system, the automatically adjusting pressure comprises automatically adjusting pump speed of the at least one adjustable coolant pump to maintain coolant pressure at the output of the at least one modular cooling unit within a range about a constant coolant pressure set point, and wherein a decrease in system coolant flow rate through the at least one liquid-cooled electronics system results in the automatically adjusting automatically decreasing pump speed of the at least one adjustable coolant pump, thereby reducing power consumption of the at least one adjustable coolant pump in cooling the at least one liquid-cooled electronics system.

Further, additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1:
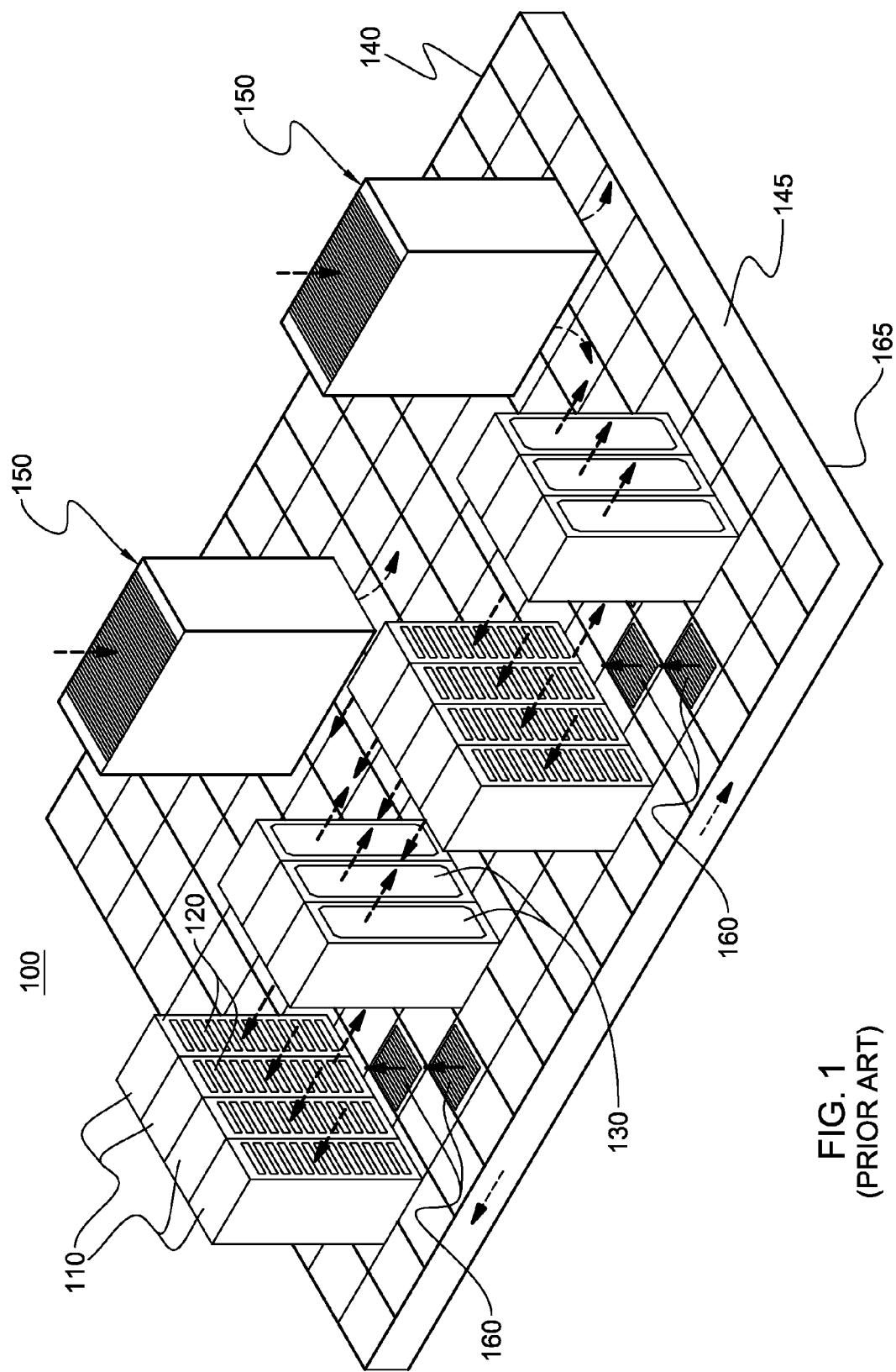
FIG. 1 depicts one embodiment of a conventional raised floor layout of an air-cooled data center.

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand alone computer processor having high, mid or low end processing capability. In one embodiment, an electronics rack may comprise multiple electronics subsystems, each having one or more heat generating components disposed therein requiring cooling. "Electronics subsystem" refers to any sub-housing, blade, book, drawer, node, compartment, etc., having one or more heat generating electronic components disposed therein. Each electronics subsystem of an electronics rack may be movable or fixed relative to the electronics rack, with the rack-mounted electronics drawers of a multi-drawer rack unit and blades of a blade center system being two examples of subsystems of an electronics rack to be cooled.

"Electronic component" refers to any heat generating electronic component of, for example, a computer system or other electronics unit requiring cooling. By way of example, an electronic component may comprise one or more integrated circuit dies and/or other electronic devices to be cooled, including one or more processor dies, memory dies and memory support dies. As a further example, the electronic component may comprise one or more bare dies or one or more packaged dies disposed on a common carrier. As used herein, "primary heat generating component" refers to a primary heat generating electronic component within an electronics subsystem, while "secondary heat generating component" refers to an electronic component of the electronics subsystem generating less heat than the primary heat generating component to be cooled. "Primary heat generating die" refers, for example, to a primary heat generating die or chip within a heat generating electronic component comprising primary and secondary heat generating dies (with a processor die being one example). "Secondary heat generating die" refers to a die of a multi-die electronic component generating less heat than the primary heat generating die thereof (with memory dies and memory support dies being examples of secondary dies to be cooled). As one example, a heat generating electronic component could comprise multiple primary heat generating bare dies and multiple secondary heat generating dies on a common carrier. Further, unless otherwise specified herein, the term "liquid-cooled cold plate" refers to any conventional thermally conductive structure having a plurality of channels or passageways formed therein for flowing of liquid coolant therethrough. In addition, "metallurgically bonded" refers generally herein to two components being welded, brazed or soldered together by any means.

As used herein, "air-to-liquid heat exchange assembly" means any heat exchange mechanism characterized as described herein through which liquid coolant can circulate; and includes, one or more discrete air-to-liquid heat exchangers coupled either in series or in parallel. An air-to-liquid heat exchanger may comprise, for example, one or more coolant flow paths, formed of thermally conductive tubing (such as copper or other tubing) in thermal or mechanical contact with a plurality of air-cooled cooling fins. Size, configuration and construction of the air-to-liquid heat exchange assembly and/or air-to-liquid heat exchanger thereof can vary without departing from the scope of the invention disclosed herein. A "liquid-to-liquid heat exchanger" may comprise, for example, two or more coolant flow paths, formed of thermally conductive tubing (such as copper or other tubing) in thermal communication with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of facility coolant and system coolant is water. However, the concepts disclosed herein are readily adapted to use with other types of coolant on the facility side and/or on the system side. For example, one or more of the coolants may comprise a brine, a fluorocarbon liquid, a liquid metal, or other similar coolant, or refrigerant, while still maintaining the advantages and unique features of the present invention.

Reference is made below to the drawings (which are not drawn to scale to facilitate understanding of the invention), wherein the same reference numbers used throughout different figures designate the same or similar components.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have one or more air moving devices (e.g., fans or blowers) to provide forced inlet-to-outlet airflow to cool the electronic devices within the subsystem(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within the data center 100. Room air is taken into each air conditioning unit 150 near an upper portion thereof This room air may comprise in part exhausted air from the "hot" aisles of the computer installation defined, for example, by opposing air outlet sides 130 of the electronics racks 110.

Due to the ever-increasing airflow requirements through electronics racks, and the limits of air distribution within the typical data center installation, liquid-based cooling is being combined with the conventional air-cooling. FIGS. 2-6 illustrate one embodiment of a data center implementation employing a liquid-based cooling system with one or more cold plates coupled to high heat-generating electronic devices disposed within the electronics racks.

Figure 2:
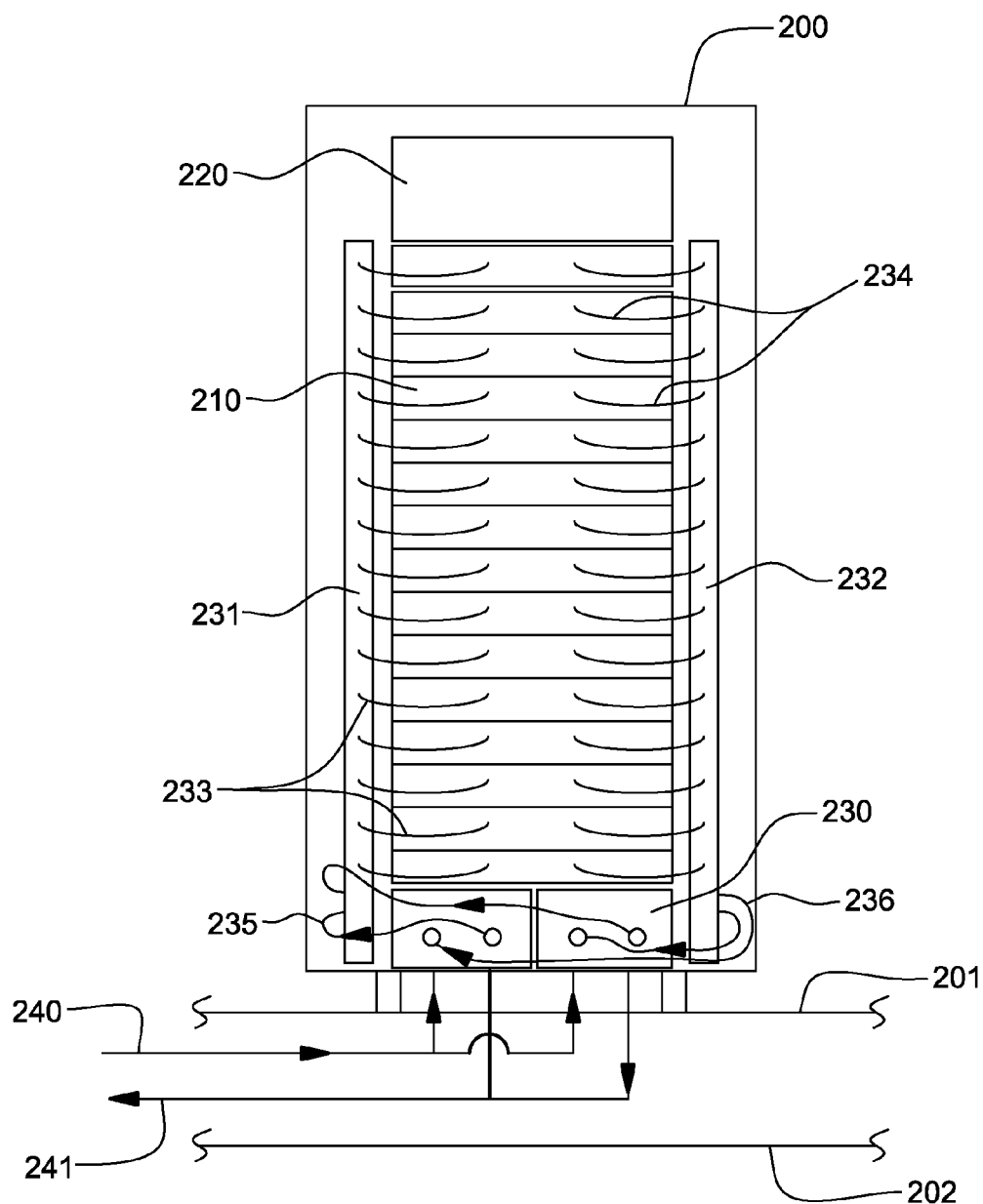
FIG. 2 is a front elevational view of one embodiment of a liquid-cooled electronics rack comprising multiple liquid electronics subsystems, in accordance with one aspect of the present invention.

FIG. 2 depicts one embodiment of a liquid-cooled electronics rack 200. As illustrated, liquid-cooled electronics rack 200 comprises a plurality of electronics subsystems 210, which may be processor or server nodes. A bulk power regulator 220 is shown disposed at an upper portion of liquid-cooled electronics rack 200, and two coolant conditioning units (CCUs) 230 are disposed in a lower portion of the liquid-cooled electronics rack. In the embodiments described herein, the coolant is assumed to be water or an aqueous-based solution (by way of example only).

In addition to CCUs 230, the cooling system includes a system water supply manifold 231, a system water return manifold 232, and manifold-to-node fluid connect hoses 233 coupling system water supply manifold 231 to electronics subsystems 210, and node-to-manifold fluid connect hoses 234 coupling the individual electronics subsystems 210 to system water return manifold 232. Each CCU 230 is in fluid communication with system water supply manifold 231 via a respective system water supply hose 235, and each CCU 230 is in fluid communication with system water return manifold 232 via a respective system water return hose 236.

As illustrated, the heat load of the electronics subsystems is transferred from the system water to cooler facility water supplied by facility water supply line 240 and facility water return line 241 disposed, in the illustrated embodiment, in the space between a raised floor 201 and a base floor 202.

Figure 3:
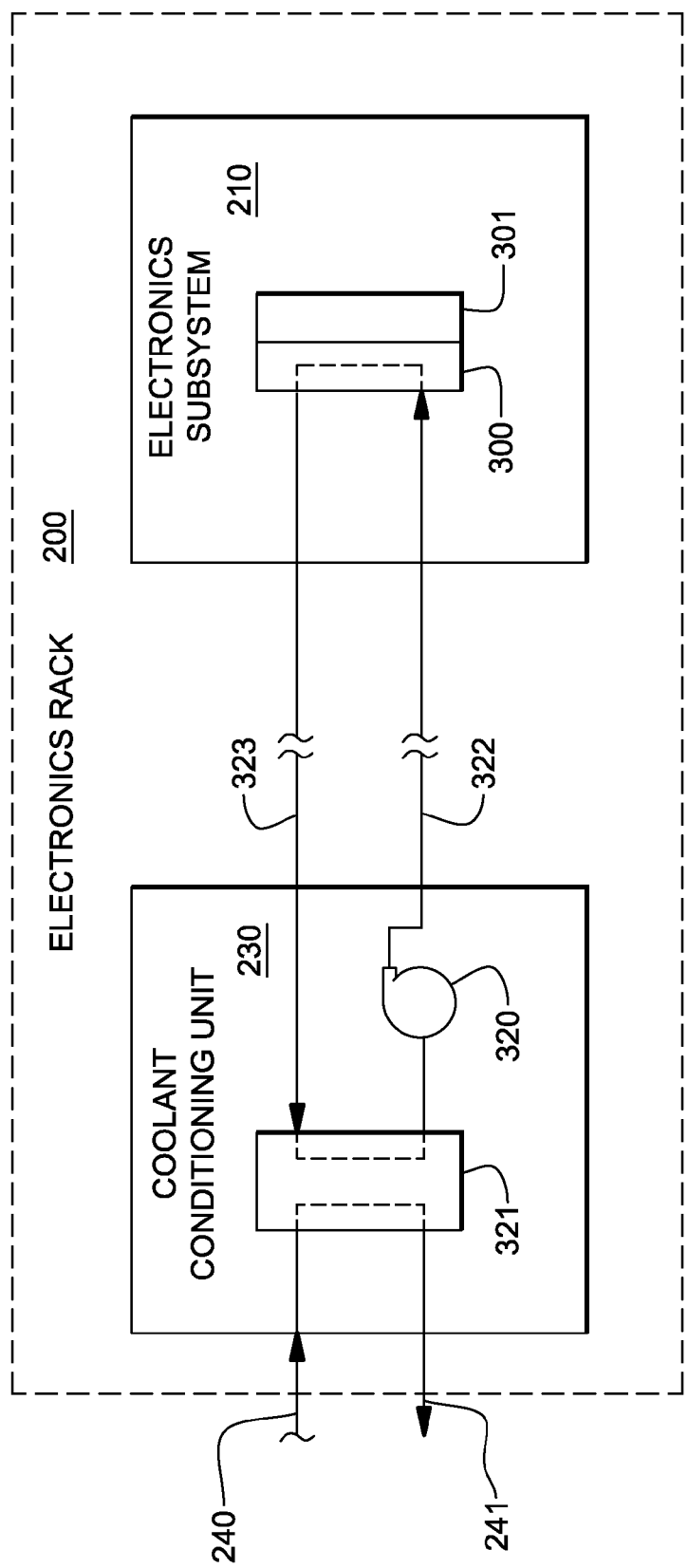
FIG. 3 is a schematic of one embodiment of an electronics rack, wherein an electronics module is liquid-cooled by system coolant provided by one or more coolant conditioning units disposed within the electronics rack, in accordance with an aspect of the present invention.

FIG. 3 schematically illustrates operation of the cooling system of FIG. 2, wherein a liquid-cooled cold plate 300 is shown coupled to an electronics module 301 of an electronics subsystem 210 within the liquid-cooled electronics rack 200. Heat is removed from electronics module 301 via the system coolant circulated via pump 320 through cold plate 300 within the system coolant loop defined by liquid-to-liquid heat exchanger 321 of coolant conditioning unit 230, lines 322, 323 and cold plate 300. The system coolant loop and coolant conditioning unit are designed to provide coolant of a controlled temperature and pressure, as well as controlled chemistry and cleanliness to the electronics module(s). Furthermore, the system coolant is physically separate from the less controlled facility coolant in lines 240, 241, to which heat is ultimately transferred.

Figure 4A:
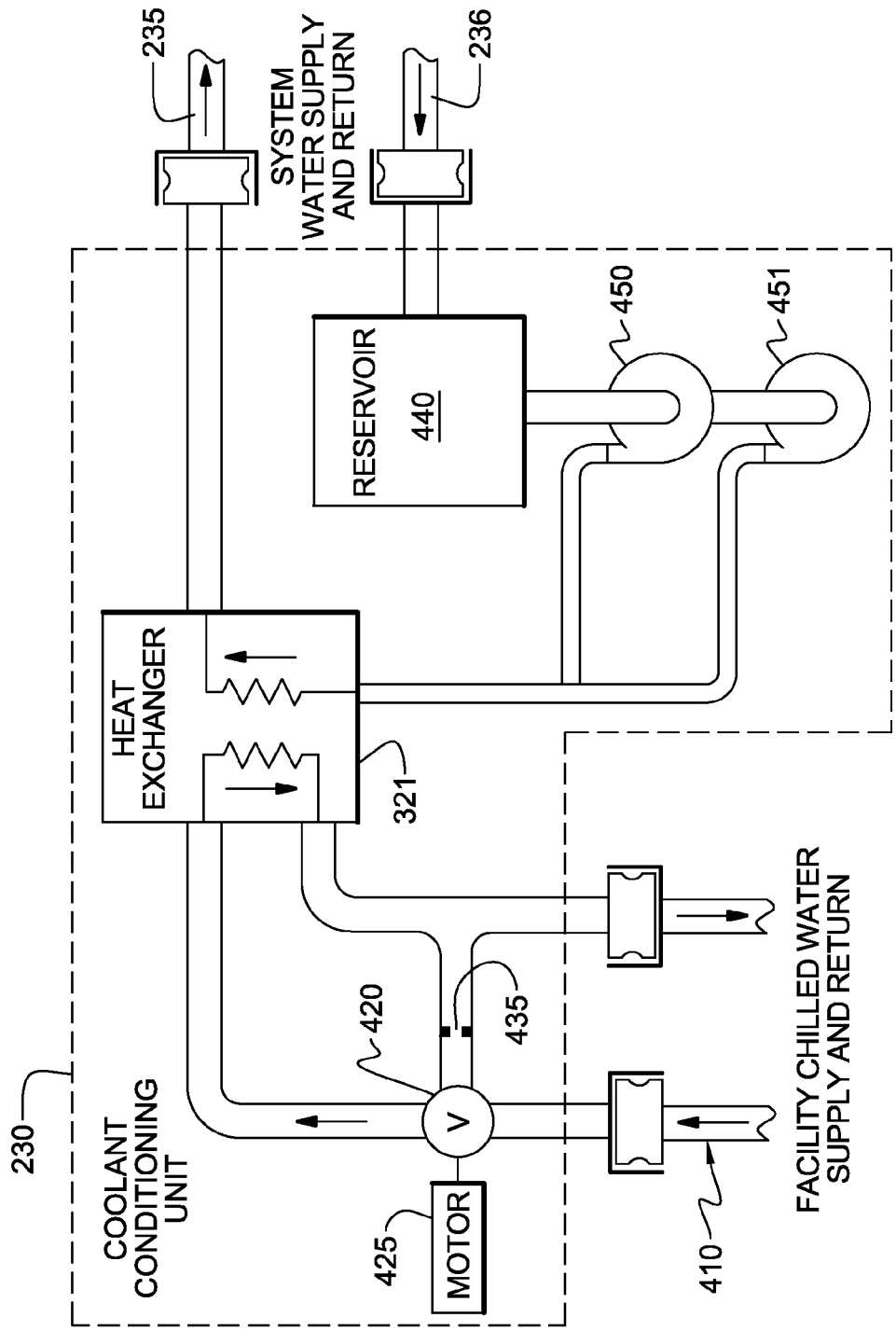
FIG. 4A is a schematic of one embodiment of a coolant conditioning unit disposed within a liquid-cooled electronics rack, in accordance with one aspect of the present invention.

FIG. 4A depicts a more detailed embodiment of a coolant conditioning unit 230. As shown in FIG. 4A, coolant conditioning unit 230 includes a first cooling loop wherein building chilled, facility coolant is supplied 410 and passes through a control valve 420 driven by a motor 425. Valve 420 determines an amount of facility coolant to be passed through heat exchanger 321, with a portion of the facility coolant possibly being returned directly via a bypass orifice 435. The coolant conditioning unit further includes a second cooling loop with a reservoir tank 440 from which system coolant is pumped, either by pump 450 or pump 451, into the heat exchanger 321 for conditioning and output thereof, as cooled system coolant to the electronics rack to be cooled. The cooled system coolant is supplied to the system water supply manifold and system water return manifold of the liquid-cooled electronics rack via the system water supply hose 235 and system water return hose 236.

Figure 4B:
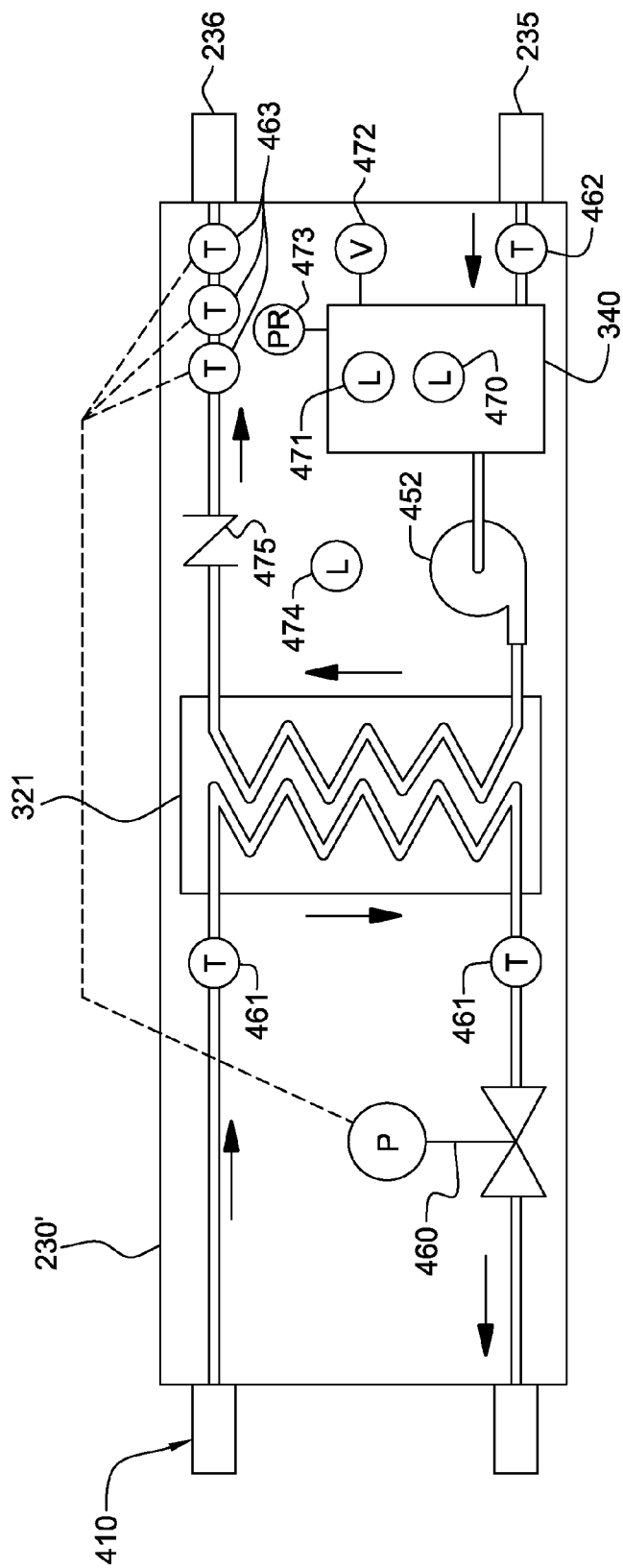
FIG. 4B is a schematic of an alternate embodiment of a coolant conditioning unit disposed within a liquid-cooled electronics rack, in accordance with an aspect of the present invention.

FIG. 4B depicts an alternate embodiment of a coolant conditioning unit 230'. As illustrated, coolant conditioning unit 230' includes a first cooling loop wherein building-chilled, facility coolant is supplied 410 and passed through heat exchanger 321. The amount of facility coolant supplied through the heat exchanger is controlled by a proportional valve 460, which may be controlled, in one embodiment, via a controller (not shown) coupled to temperature sensor 463 on a second cooling loop of the coolant conditioning unit 230'. This second cooling loop comprises the system coolant. As shown, temperature sensor 462 is in fluid communication with system water supply hose 235, while redundant temperature sensors 463 are in fluid communication with system water return hose 236. By monitoring temperature of the returning system water, the supplied system water, as well as the supplied facility coolant and exhausted facility coolant, the controller can control the amount of facility coolant passing through the liquid-to-liquid heat exchanger of the coolant conditioning unit 230' to maintain the system water within a desired temperature range.

As illustrated, the second cooling loop further includes a reservoir tank 340 and a system coolant pump 452, which in one embodiment may comprise a magnetically-coupled, centrifugal pump. Two liquid level sensors 470, 471 are provided within reservoir tank 340 to monitor flow of system water through the second cooling loop. A third liquid level sensor 474 is provided, by way of example, in a leak detection pan (not shown) in a lower portion of coolant conditioning unit 230'. In this embodiment, reservoir tank 340 further includes a vacuum breaker valve 472, and a pressure relief valve 473. Additionally, a check valve 475 is provided in the system water return line portion of the second cooling loop coupled to system water return hose 236. Note that the couplings to the system water supply and return hoses may be via quick connect couplings, as well as the couplings to the building-chilled, facility coolant supply and return lines.

Figure 5:
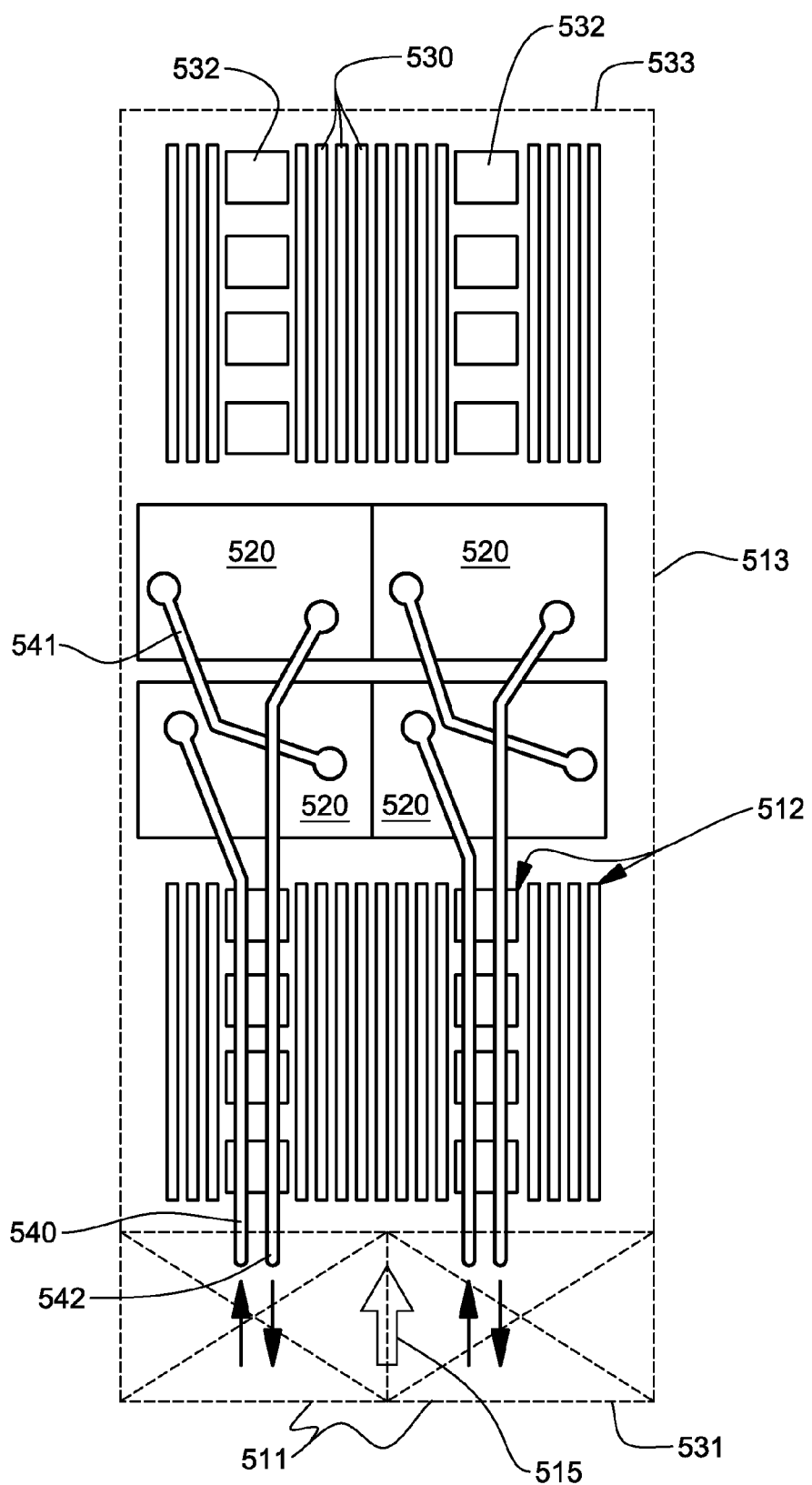
FIG. 5 is a plan view of one embodiment of an electronics subsystem layout illustrating an air and liquid cooling system for cooling components of the electronics subsystem, in accordance with an aspect of the present invention.

FIG. 5 depicts one embodiment of an electronics subsystem 513 component layout wherein one or more air moving devices 511 provide forced air flow 515 to cool multiple components 512 within electronics subsystem 513. Cool air is taken in through a front 531 and exhausted out a back 533 of the drawer. The multiple components to be cooled include multiple processor modules to which liquid-cooled cold plates 520 (of a liquid-based cooling system) are coupled, as well as multiple arrays of memory modules 530 (e.g., dual in-line memory modules (DIMMs)) and multiple rows of memory support modules 532 (e.g., DIMM control modules) to which air-cooled heat sinks are coupled. In the embodiment illustrated, memory modules 530 and the memory support modules 532 are partially arrayed near front 531 of electronics subsystem 513, and partially arrayed near back 533 of electronics subsystem 513. Also, in the embodiment of FIG. 5, memory modules 530 and the memory support modules 532 are cooled by air flow 515 across the electronics subsystem.

The illustrated liquid-based cooling system further includes multiple coolant-carrying tubes connected to and in fluid communication with liquid-cooled cold plates 520. The coolant-carrying tubes comprise sets of coolant-carrying tubes, with each set including (for example) a coolant supply tube 540, a bridge tube 541 and a coolant return tube 542. In this example, each set of tubes provides liquid coolant to a series-connected pair of cold plates 520 (coupled to a pair of processor modules). Coolant flows into a first cold plate of each pair via the coolant supply tube 540 and from the first cold plate to a second cold plate of the pair via bridge tube or line 541, which may or may not be thermally conductive. From the second cold plate of the pair, coolant is returned through the respective coolant return tube 542.

Figure 6:
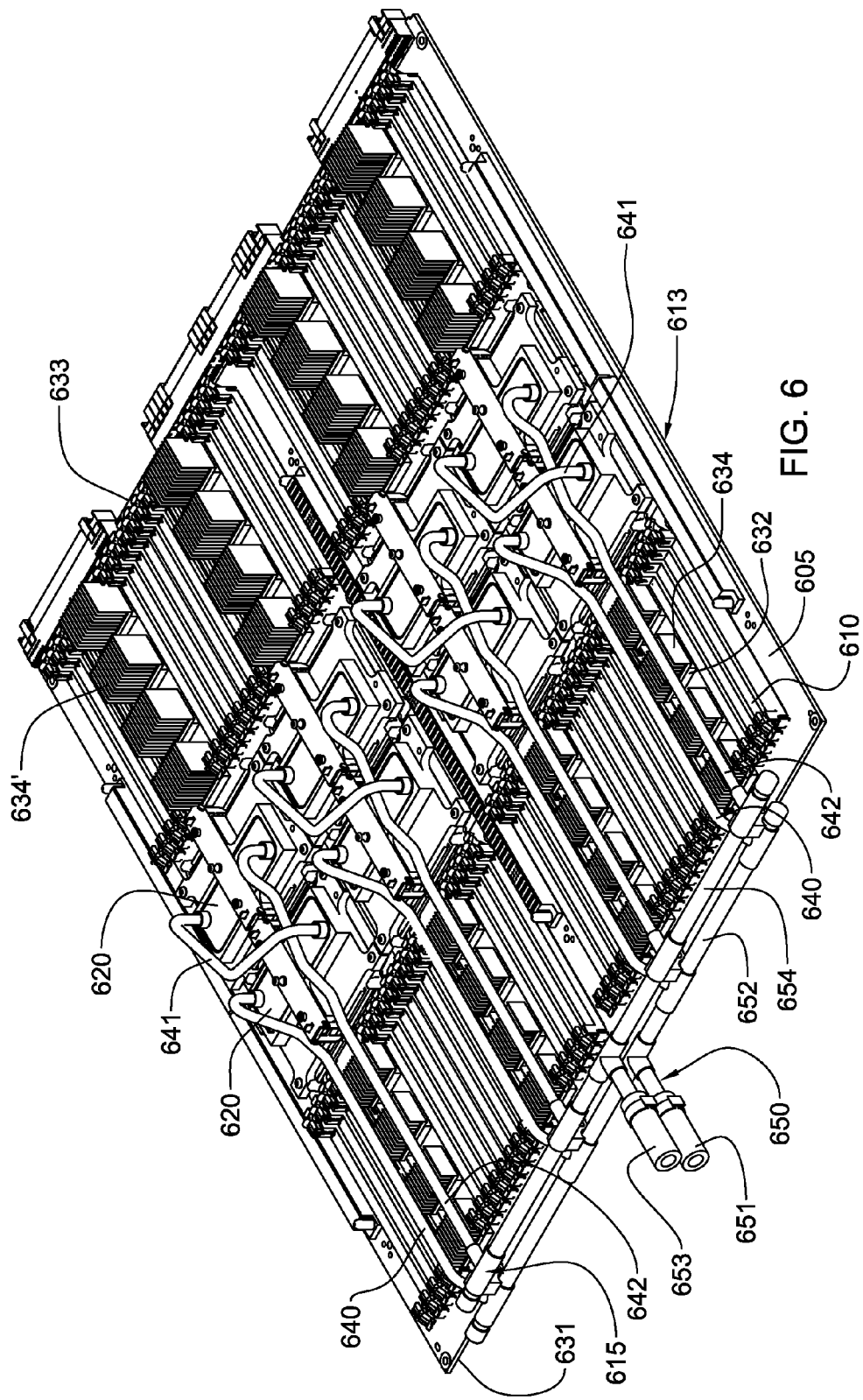
FIG. 6 depicts one detailed embodiment of a partially-assembled electronics subsystem layout, wherein the electronics subsystem includes eight heat-generating electronics components to be actively cooled, each having a respective liquid-cooled cold plate of a liquid-based cooling system coupled thereto, in accordance with an aspect of the present invention.

FIG. 6 depicts in greater detail an alternate electronics drawer layout comprising eight processor modules, each having a respective liquid-cooled cold plate of a liquid-based cooling system coupled thereto. The liquid-based cooling system is shown to further include associated coolant-carrying tubes for facilitating passage of liquid coolant through the liquid-cooled cold plates and a header subassembly to facilitate distribution of liquid coolant to and return of liquid coolant from the liquid-cooled cold plates. By way of specific example, the liquid coolant passing through the liquid-based cooling subsystem is chilled water.

As noted, various liquid coolants significantly outperform air in the task of removing heat from heat generating electronic components of an electronics system, and thereby more effectively maintain the components at a desireable temperature for enhanced reliability and peak performance. As liquid-based cooling systems are designed and deployed, it is advantageous to architect systems which maximize reliability and minimize the potential for leaks while meeting all other mechanical, electrical and chemical requirements of a given electronics system implementation. These more robust cooling systems have unique problems in their assembly and implementation. For example, one assembly solution is to utilize multiple fittings within the electronics system, and use flexible plastic or rubber tubing to connect headers, cold plates, pumps and other components. However, such a solution may not meet a given customer's specifications and need for reliability.

Thus, presented herein in one aspect is a robust and reliable liquid-based cooling system specially preconfigured and prefabricated as a monolithic structure for positioning within a particular electronics drawer.

FIG. 6 is an isometric view of one embodiment of an electronics drawer and monolithic cooling system, in accordance with an aspect of the present invention. The depicted planar server assembly includes a multi-layer printed circuit board to which memory DIMM sockets and various electronic components to be cooled are attached both physically and electrically. In the cooling system depicted, a supply header is provided to distribute liquid coolant from a single inlet to multiple parallel coolant flow paths and a return header collects exhausted coolant from the multiple parallel coolant flow paths into a single outlet. Each parallel coolant flow path includes one or more cold plates in series flow arrangement to cool one or more electronic components to which the cold plates are mechanically and thermally coupled. The number of parallel paths and the number of series-connected liquid-cooled cold plates depends, for example on the desired device temperature, available coolant temperature and coolant flow rate, and the total heat load being dissipated from each electronic component.

More particularly, FIG. 6 depicts a partially assembled electronics system 613 and an assembled liquid-based cooling system 615 coupled to primary heat generating components (e.g., including processor dies) to be cooled. In this embodiment, the electronics system is configured for (or as) an electronics drawer of an electronics rack, and includes, by way of example, a support substrate or planar board 605, a plurality of memory module sockets 610 (with the memory modules (e.g., dual in-line memory modules) not shown), multiple rows of memory support modules 632 (each having coupled thereto an air-cooled heat sink 634), and multiple processor modules (not shown) disposed below the liquid-cooled cold plates 620 of the liquid-based cooling system 615.

In addition to liquid-cooled cold plates 620, liquid-based cooling system 615 includes multiple coolant-carrying tubes, including coolant supply tubes 640 and coolant return tubes 642 in fluid communication with respective liquid-cooled cold plates 620. The coolant-carrying tubes 640, 642 are also connected to a header (or manifold) subassembly 650 which facilitates distribution of liquid coolant to the coolant supply tubes and return of liquid coolant from the coolant return tubes 642. In this embodiment, the air-cooled heat sinks 634 coupled to memory support modules 632 closer to front 631 of electronics drawer 613 are shorter in height than the air-cooled heat sinks 634' coupled to memory support modules 632 near back 633 of electronics drawer 613. This size difference is to accommodate the coolant-carrying tubes 640, 642 since, in this embodiment, the header subassembly 650 is at the front 631 of the electronics drawer and the multiple liquid-cooled cold plates 620 are in the middle of the drawer.

Liquid-based cooling system 615 comprises a pre-configured monolithic structure which includes multiple (pre-assembled) liquid-cooled cold plates 620 configured and disposed in spaced relation to engage respective heat generating electronic components. Each liquid-cooled cold plate 620 includes, in this embodiment, a liquid coolant inlet and a liquid coolant outlet, as well as an attachment subassembly (i.e., a cold plate/load arm assembly). Each attachment subassembly is employed to couple its respective liquid-cooled cold plate 620 to the associated electronic component to form the cold plate and electronic component assemblies. Alignment openings (i.e., thru-holes) are provided on the sides of the cold plate to receive alignment pins or positioning dowels during the assembly process. Additionally, connectors (or guide pins) are included within attachment subassembly which facilitate use of the attachment assembly.

As shown in FIG. 6, header subassembly 650 includes two liquid manifolds, i.e., a coolant supply header 652 and a coolant return header 654, which in one embodiment, are coupled together via supporting brackets. In the monolithic cooling structure of FIG. 6, the coolant supply header 652 is metallurgically bonded in fluid communication to each coolant supply tube 640, while the coolant return header 654 is metallurgically bonded in fluid communication to each coolant return tube 652. A single coolant inlet 651 and a single coolant outlet 653 extend from the header subassembly for coupling to the electronics rack's coolant supply and return manifolds (not shown).

FIG. 6 also depicts one embodiment of the pre-configured, coolant-carrying tubes. In addition to coolant supply tubes 640 and coolant return tubes 642, bridge tubes or lines 641 are provided for coupling, for example, a liquid coolant outlet of one liquid-cooled cold plate to the liquid coolant inlet of another liquid-cooled cold plate to connect in series fluid flow the cold plates, with the pair of cold plates receiving and returning liquid coolant via a respective set of coolant supply and return tubes. In one embodiment, the coolant supply tubes 640, bridge tubes 641 and coolant return tubes 642 are each pre-configured, semi-rigid tubes formed of a thermally conductive material, such as copper or aluminum, and the tubes are respectively brazed, soldered or welded in a fluid-tight manner to the header subassembly and/or the liquid-cooled cold plates. The tubes are pre-configured for a particular electronics system to facilitate installation of the monolithic structure in engaging relation with the electronics system.

The above-described liquid cooling approach of FIGS. 2-6 is an effective solution for circulating water through liquid-cooled cold plates attached to heat-generating circuit modules (or components). In the embodiment of FIGS. 2-6, one or more coolant conditioning units containing a pump and, for example, a water-to-water heat exchanger, are disposed within each electronics rack. As explained above, heat load carried by the system coolant circulating through the liquid-cooled components in the liquid-cooled electronics rack is rejected to facility chilled water passing through the second coolant path through the active water-to-water heat exchangers within the coolant conditioning units disposed within the rack units.

Figure 7:
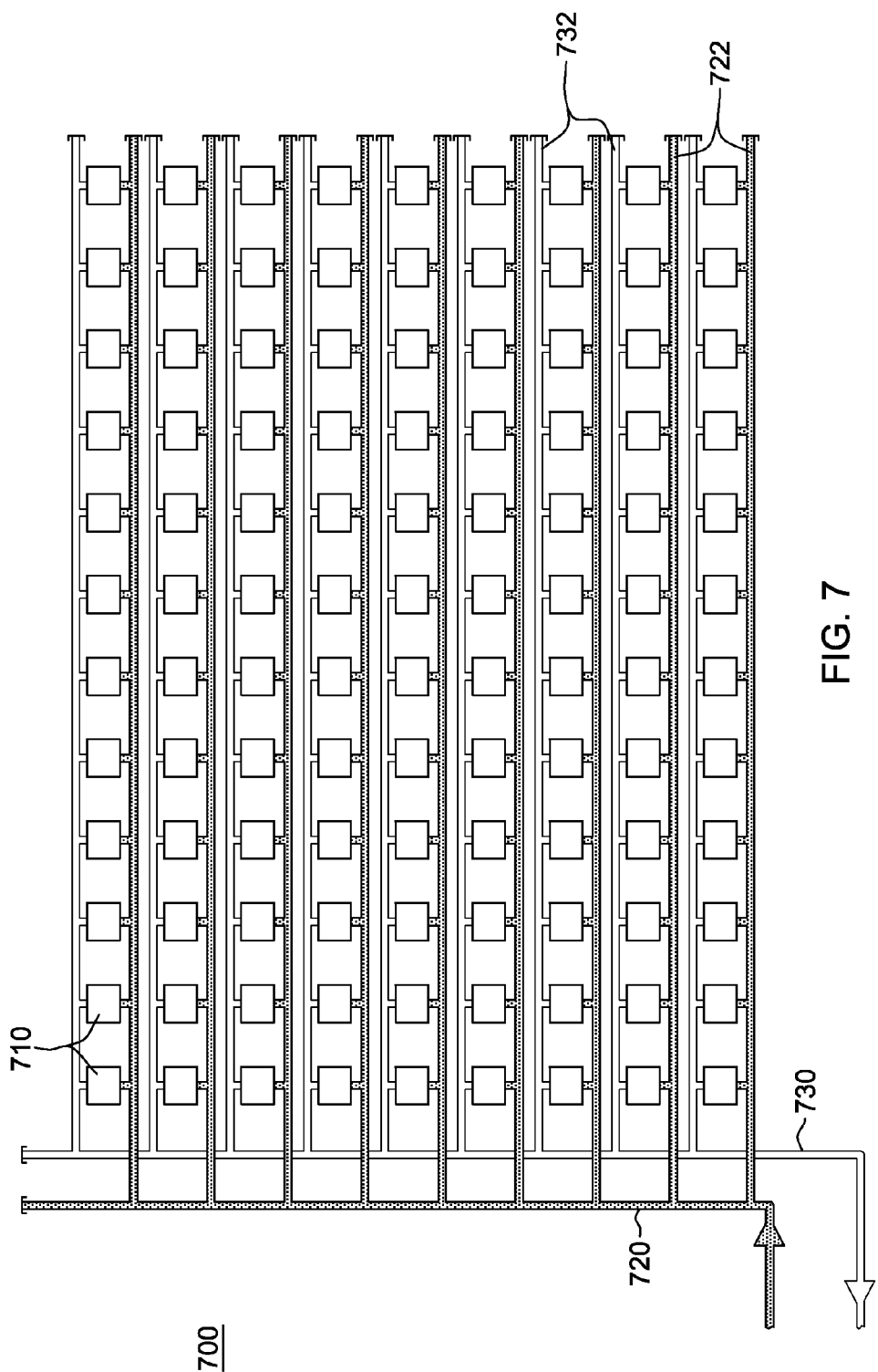
FIG. 7 is a schematic of one embodiment of a facility coolant delivery system for a data center comprising a plurality of liquid-cooled electronics racks such as depicted in FIG. 2, in accordance with an aspect of the present invention.

FIG. 7 illustrates one embodiment of a data center 700, employing a plurality of liquid-cooled electronics racks 710, such as those described above in connection with FIGS. 2-6. In this data center, a facility coolant delivery approach is illustrated which includes a main facility coolant supply line 720 having a plurality of facility coolant supply branch lines 722 extending therefrom in fluid communication with the plurality of liquid-cooled electronics racks 710 to facilitate passage of chilled facility coolant through the coolant conditioning units (CCUs) within the liquid-cooled electronics racks (as described above). A main facility coolant return line 730 similarly has a plurality of facility coolant return branch lines 732 extending thereto from the plurality of liquid-cooled electronics racks 710. Together, the main facility coolant supply and return lines 720, 730 and facility coolant supply and return branch lines 722, 732 facilitate the flow of facility coolant through the coolant conditioning units of the liquid-cooled electronics racks as described above in connection with FIGS. 2-4.

Although the cooling approach described above works well, for installations requiring larger numbers of electronics racks (for example, 20, 30 or more), a more centralized cooling approach with a smaller number of coolant pumps may be more cost effective. Also, as power consumed increases, electronics rack heat dissipation grows, and greater liquid coolant flow rates may be required, which would necessitate larger pumps within the racks. The installation of much larger pumps within the electronics racks is problematic, and even if possible, would take up valuable space that could otherwise be utilized to house additional computing nodes. In addition, supplying facility chilled water directly to the electronics racks within the data center makes it necessary to impose more stringent water quality and cleanliness requirements on the customer's facility water.

Generally stated, therefore, disclosed herein with reference to FIGS. 8-14B, is a cooling system which replaces the coolant conditioning units within each electronics rack with multiple, uninterruptible and scalable modular cooling units optimally positioned within the data center to provide a distributed cooling interface between the facility chilled coolant supply (e.g., facility water or refrigerant) and the system coolant circulating through, for example, liquid-cooled cold plates disposed within the electronics racks.

In one embodiment, the modular cooling units described hereinbelow are clustered and distributed about a main system coolant supply loop and a main system coolant return loop of the cooling system for facilitating circulating of cooled system coolant through the electronics racks and rejecting heat load from the exhausted system coolant to the facility coolant. By way of example, each modular cooling unit includes a heat exchanger and pumping module, which facilitates scalability of the cooling system in terms of system coolant flow rate and heat load capacity.

Figure 8:
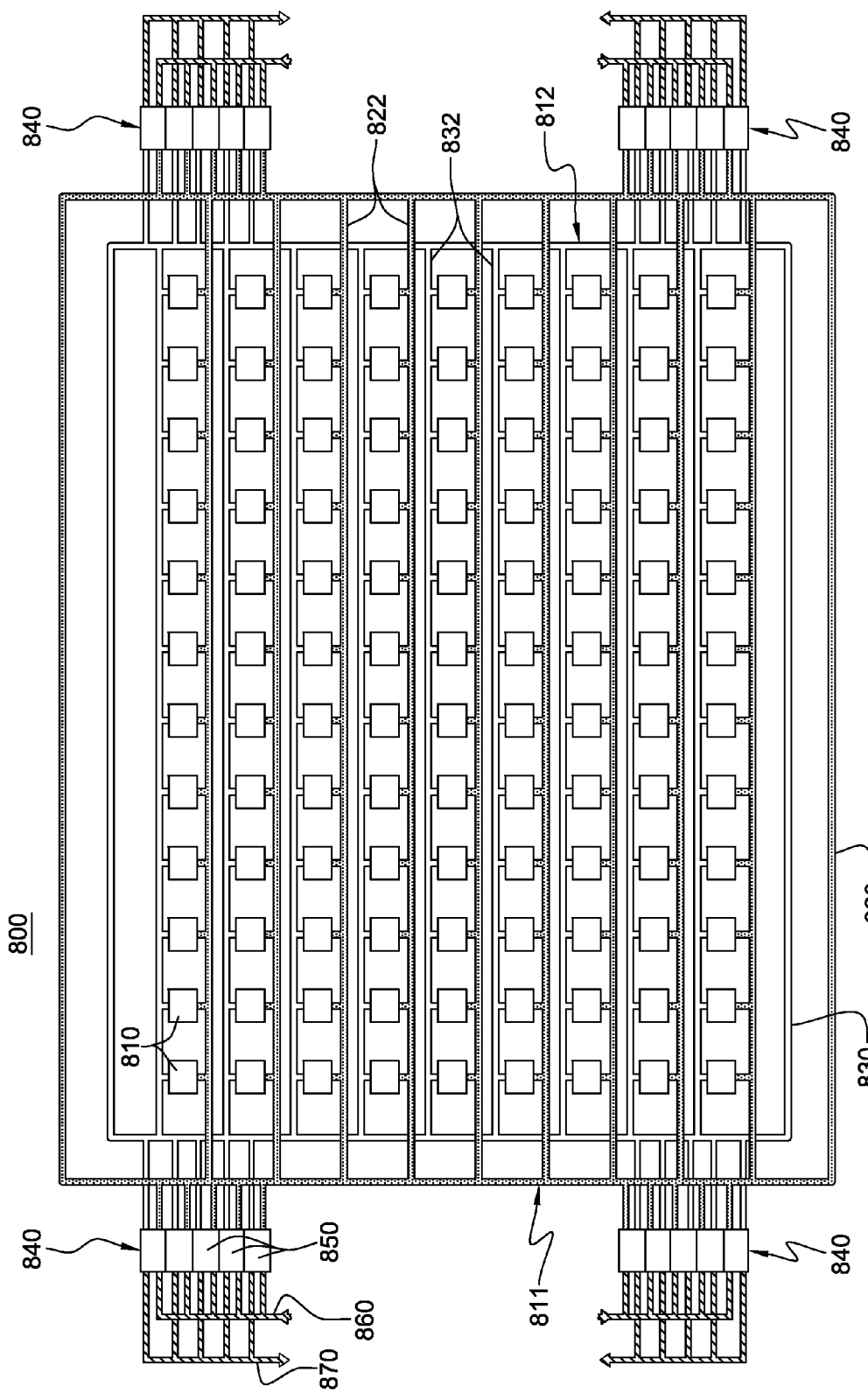
FIG. 8 is a schematic of another embodiment of a cooling system for a data center comprising a plurality of liquid-cooled electronics racks, in accordance with an aspect of the present invention.

FIG. 8 depicts one embodiment of a data center 800 comprising a plurality of liquid-cooled electronics racks 810 aligned in multiple rows and cooled via a cooling system which comprises a system coolant supply manifold 811 and a system coolant return manifold 812, as well as multiple clusters 840 of modular cooling units 850. System coolant supply manifold 811 includes a main system coolant supply loop 820, which (in the embodiment illustrated) encircles an area within which the rows of electronics racks are disposed, and a plurality of system coolant supply branch lines 822 extending from main system coolant supply loop 820 and in fluid communication therewith at multiple locations. Specifically, in the embodiment illustrated, each system coolant supply branch line 822 is in fluid communication with main system coolant supply loop 820 at each end thereof (by way of example) to better facilitate supply of cooled system coolant to the plurality of liquid-cooled electronics racks 810. When operational, cooled system coolant circulates through the main system coolant supply loop 820, and enters a system coolant supply branch line 822 at either end thereof before flowing to the one or more liquid-cooled electronics racks in fluid communication with that system coolant supply branch line 822. In an alternate configuration, one or more auxiliary coolant flow lines (not shown) might be in fluid communication with one or more of the lines making up the main system coolant supply loop and/or one or more of the system coolant supply branch lines 822 extending therefrom. For example, an auxiliary coolant flow line could be in fluid communication at its ends with the main system coolant supply loop and be disposed transverse to the system coolant supply branch lines 822 depicted in FIG. 8. Note that similar auxiliary coolant flow lines could be provided in association with the system coolant return manifold components described below as well.

The system coolant return manifold 812 comprises a main system coolant return loop 830 and a plurality of system coolant return branch lines 832 which, as shown, are in fluid communication at each end with main system coolant return loop 830. The plurality of system coolant return branch lines 832 are also in fluid communication with the plurality of liquid-cooled electronics racks 810 for facilitating recirculation of exhausted system coolant from the plurality of liquid-cooled electronics racks 810 through modular cooling units 850 to main system coolant supply loop 820. When operational, exhausted system coolant circulates through the main system coolant return loop 830. In the embodiment illustrated, main system coolant return loop 830 is disposed about the perimeter of the plurality of liquid-cooled electronics racks of the data center 800, i.e., the main system coolant return loop encircles an area within which the rows of electronics racks are disposed. As noted above, one or more auxiliary coolant flow lines (not shown) could be in fluid communication with one or more of the lines making up the main system coolant return loop 830 and/or one or more of the system coolant return branch lines 832 extending therefrom, as desired for a particular cooling system implementation.

As shown, multiple clusters 840 of modular cooling units 850 are disposed about data center 800 in fluid communication with main system coolant supply loop 820 and main system coolant return loop 830. These clusters 840 of modular cooling units 850 are optimally distributed about the perimeter of the electronics racks in fluid communication with the main system coolant supply and return loops, each of which has a ring-like configuration. Placement of the clusters of modular cooling units at each corner of the supply and return loops (that is, in each quadrant of the loops) results in a reduction in the average coolant flow path length to the electronics racks, thereby facilitating reduction in the pressure drop through the closed loop path. This allows for the use of smaller diameter pipes for the branch lines, which in one embodiment, reduces congestion in the under-floor space housing these lines. Also, as noted, although connections for the main system coolant supply loop and main system coolant return loop to the respective branch lines are shown near the locations of the clusters 840 of modular cooling units 850, it should be appreciated that additional, auxiliary coolant flow line connections may be made along the lines of the main system coolant supply and return loops at the top and bottom of the ring-shaped configurations, and between or to the individual branch lines supplying coolant to or exhausting coolant from the array of electronics racks. Note that the clusters of modular cooling units act in concert, so the loss of a single modular cooling unit (or even an entire cluster of modular cooling units) will not cause a cooling interruption to the data center operation. Also, since only controlled system coolant (e.g., conditioned water) is circulating within the electronics racks, the coolant quality cleanliness requirements placed on the customer's facility coolant do not need to be as stringent.

As explained further below, each modular cooling unit includes a liquid-to-liquid heat exchanger which comprises a first coolant path and a second coolant path. The first coolant path is in fluid communication with the main system coolant return loop and the main system coolant supply loop to facilitate passing a portion of exhausted system coolant from the main system coolant return loop through the heat exchanger for cooling and subsequent output thereof to the main system coolant supply loop as cooled system coolant. The second coolant path is coupled in fluid communication with a facility coolant supply line 860 and a facility coolant return line 870 to facilitate passing chilled facility coolant through the heat exchanger for cooling exhausted system coolant passing through the first coolant loop of the heat exchanger.

Figure 9:
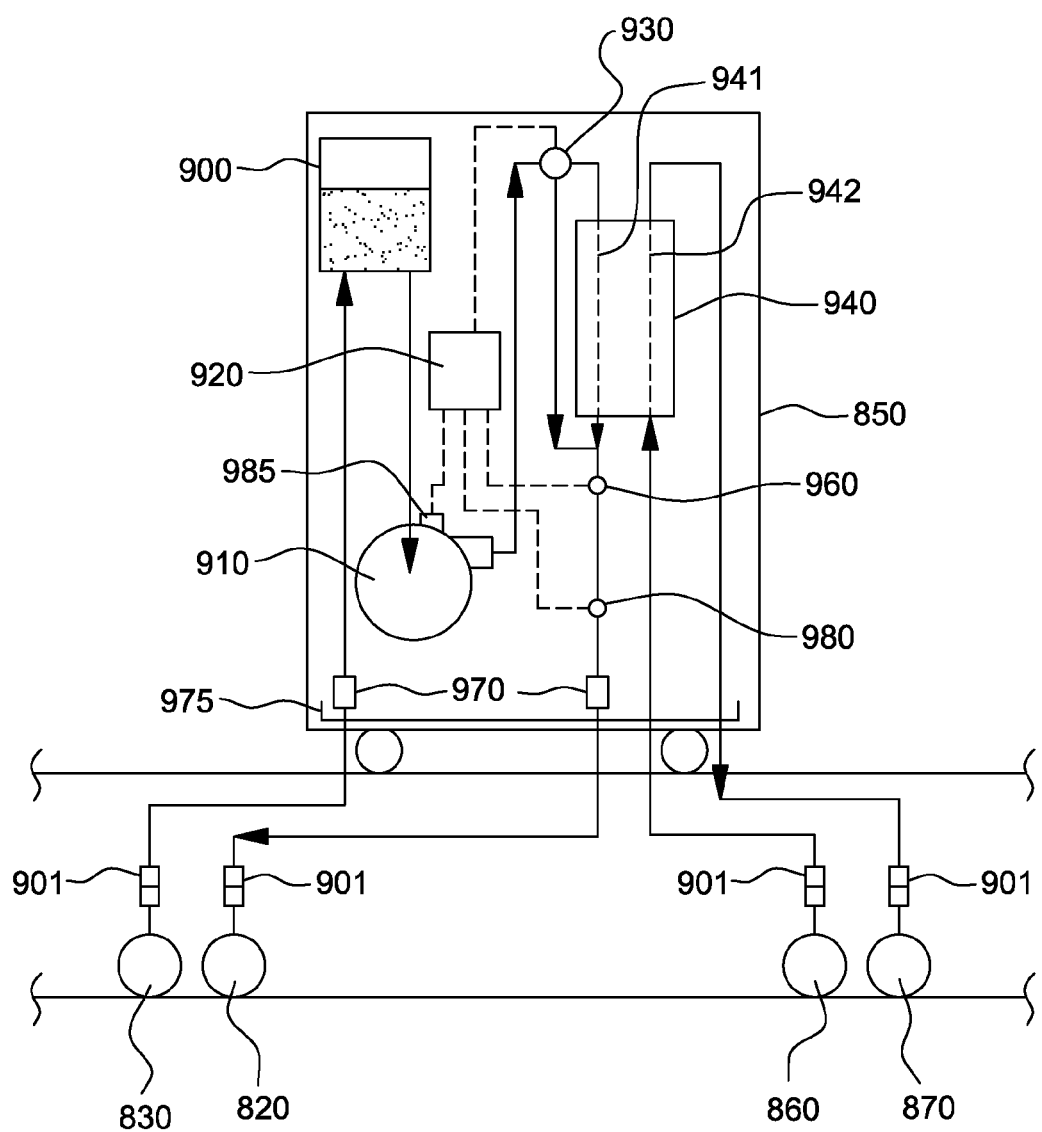
FIG. 9 is a schematic of one embodiment of a modular cooling unit of the plurality of modular cooling units distributed about the main system coolant supply loop and the main system coolant return loop of the cooling system of FIG. 8, in accordance with an aspect of the present invention.

FIG. 9 depicts one embodiment of a modular cooling unit 850 disposed on a raised floor of a data center. In this embodiment, main system coolant supply loop 820, main system coolant return loop 830, facility coolant supply line 860 and facility coolant return line 870 are depicted beneath the raised floor. The modular cooling unit 850 connects to the supply and return loops, and the facility coolant supply and return lines via respective quick connect couplings 901. By way of example, quick connect couplings 901 may comprise any one of various types of commercially available couplings, such as those available from Colder Products Company, of St. Paul, Minn., U.S.A., or Parker Hannifin, of Cleveland, Ohio, U.S.A.

A portion of the exhausted system coolant flowing through main system coolant return loop 830 is drawn into modular cooling unit 850 into a reservoir (e.g., expansion tank) 900 in fluid communication with a coolant pump 910. Coolant pump 910 feeds coolant to a liquid-to-liquid heat exchanger 940 via a flow control valve 930. Flow control valve 930 is a proportional control flow mixing valve, which allows for control of the amount of exhausted system coolant flowing through first coolant path 941 of liquid-to-liquid heat exchanger 940 based on a sensed temperature ($T_S$) provided by temperature sensor 960 at the output of liquid-to-liquid heat exchanger 940. A controller 920 is in communication with temperature sensor 960 and flow control valve 930 to monitor temperature of the cooled system coolant and to control the amount of system coolant passing through first coolant path 941 of liquid-to-liquid heat exchanger 940 (and thereby passing around the first coolant path 941 of liquid-to-liquid heat exchanger 940, as shown). Facility coolant flow through the second coolant path 942 of liquid-to-liquid heat exchanger 940 is established via connections to facility coolant supply line 860 and facility coolant return line 870, as shown. Electrically actuated flow shut-off valves 970 are disposed at the inlet and outlet lines of modular cooling unit 850 for automated shut off of coolant flow through the cooling unit when, for example, there is a pump or heat exchanger failure. A leak detection pan 975 is also provided within modular cooling unit 850 to facilitate detection of a coolant leak within the cooling unit.

As illustrated in FIG. 9, the modular cooling unit further includes a pressure sensor 980 at an output of the modular cooling unit (which is in fluid communication with main system coolant supply loop 820) to provide a feedback signal to controller 920. Controller 920 regulates via, for example, variable frequency drive 985, pump speed of adjustable coolant pump 910 to maintain system coolant delivery pressure from the modular cooling unit to the main system coolant supply loop 820 within a range about a constant coolant pressure set point. In accordance with an aspect of the present invention, adjustment in pressure at the output of the individual modular cooling units follows, but it is otherwise independent of, an adjustment in overall system coolant flow through the plurality of liquid-cooled electronics racks resulting from an adjustment in system coolant flow through one or more of the electronics racks.

In one embodiment, multiple modular cooling units 850 are coupled together to form a cluster of modular cooling units, such as illustrated in FIG. 8. Although not shown in FIGS. 8 & 9, a power and control sub-frame may be mounted at the end of each cluster of modular cooling units to power and monitor the functions of each heat exchanger and pumping component within the modular cooling units of the cluster. The temperature of the system coolant supplied by each modular cooling unit is controlled by monitoring the temperature of system coolant leaving the heat exchanger and using the difference between the temperature monitored and one or more set point supply temperatures to provide a feedback signal which adjusts the flow control valve controlling the percentage of system coolant flowing through (or around) the liquid-to-liquid heat exchanger.

Figure 10:
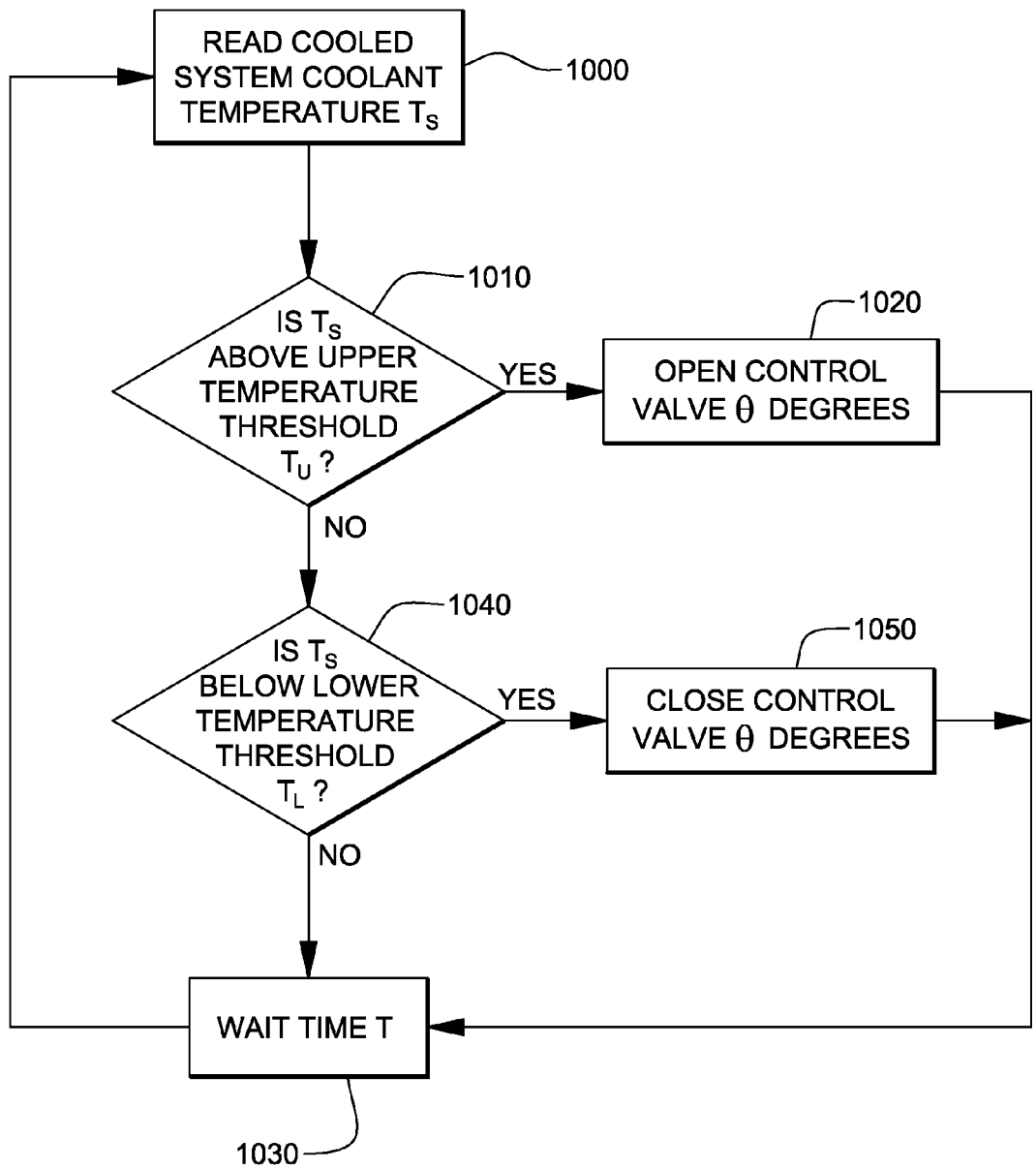
FIG. 10 is a flowchart of one embodiment of logic for controlling temperature of system coolant being provided by the modular cooling unit of FIG. 9 to the main system coolant supply loop of the cooling system of FIG. 8, in accordance with an aspect of the present invention.

FIG. 10 depicts one flowchart of controller logic for controlling the temperature of cooled system coolant being supplied by the modular cooling unit to the main system coolant supply loop. The cooled system coolant temperature $T_S$ is ascertained 1000, and a determination is made whether temperature $T_S$ is above an upper temperature threshold $T_U$ 1010. If "yes", then the flow control valve within the modular cooling unit is opened by a preset amount (i.e., θ°) 1020. Once the control valve has been adjusted, logic waits a time interval T 1030, before again ascertaining the cooled system coolant temperature $T_S$ departing the modular cooling unit 1000. If temperature $T_S$ is below the upper temperature threshold $T_U$, then a determination is made whether temperature $T_S$ is below a lower temperature threshold $T_L$ 1040. If "yes", then the flow control valve within the modular cooling unit is closed by a preset amount, (for example, θ°) 1050, after which the logic waits time interval T 1030 before again ascertaining the temperature $T_S$ of cooled system coolant 1000 being output from the modular cooling unit.

As briefly noted above, in accordance with one aspect, significant power reduction and energy savings is achieved herein by reducing pump speed within the modular cooling units as the overall system flow impedance increases. This is accomplished by simultaneously, but independently, controlling flow rate through the individual liquid-cooled electronics racks, as well as system coolant pressure in the piping supply network, that is, the main system coolant supply loop and system coolant return branch lines of the system coolant supply manifold.

Figure 11:
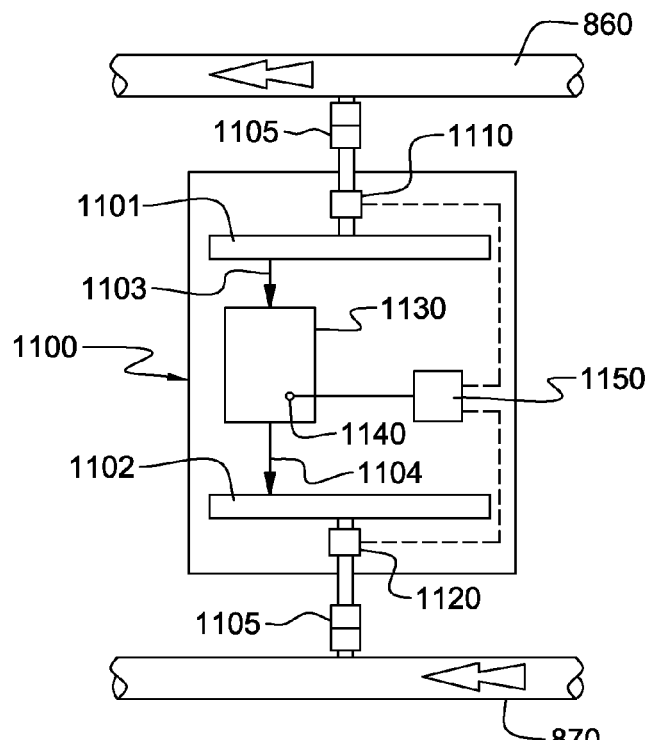
FIG. 11 is a schematic of one embodiment of a liquid-cooled electronics rack with temperature monitoring and system coolant flow regulation, in accordance with an aspect of the present invention.

Within each liquid-cooled electronics rack, one or more temperature sensors are used to monitor temperature of one or more critical components within the electronics rack. As illustrated in FIG. 11, a liquid-cooled electronics rack 1100 is coupled in fluid communication with a system coolant supply branch line 860 and a system coolant return branch line 870. These fluid couplings may be via respective quick connect couplings 1105. A rack-level system coolant supply manifold 1101 is coupled in fluid communication with system coolant supply branch line 860 and a rack-level system coolant return manifold 1102 is coupled in fluid communication with system coolant return branch line 870. A coolant supply line 1103 and a coolant return line 1104 connect a liquid-cooled cold plate (not shown) on critical component 1130 to rack-level system coolant supply manifold 1101 and rack-level system coolant return manifold 1102, respectively. A flow throttling valve 1110 is disposed between system coolant supply branch line 860 and rack-level system coolant supply manifold 1101 for allowing dynamic adjustment of system coolant flow through the liquid-cooled electronics rack 1100. Further, an electrically actuated flow shut off valve 1120 is disposed between rack-level system coolant return manifold 1102 and system coolant return branch line 870 for facilitating isolation of the liquid-cooled electronics rack from the cooling system, for example, for servicing thereof.

System coolant flow through liquid-cooled electronics rack 1100 is controlled, in one embodiment, by designating a critical component (or more than one critical component) 1130 within the liquid-cooled electronics rack for which temperature is to be monitored and maintained within an operating range. A temperature sensor 1140 is positioned to sense a temperature associated with the designated critical component(s) 1130. Temperature sensor 1140 provides monitored temperature to a coolant flow controller 1150, which is coupled to and controls flow throttling valve 1110 and electrically actuated flow shut off valve 1120. In one embodiment, the designated critical component(s) might comprise a critical processor node within a stack of processor nodes in the liquid-cooled electronics rack. The critical component to be monitored, and the required operating set point temperatures may be pre-determined by analysis and simulation to ensure that if the critical component is within its allowable temperature band (i.e., within the operating set point temperatures), then all other components in the electronics rack are also being satisfactorily cooled.

Figure 12A:
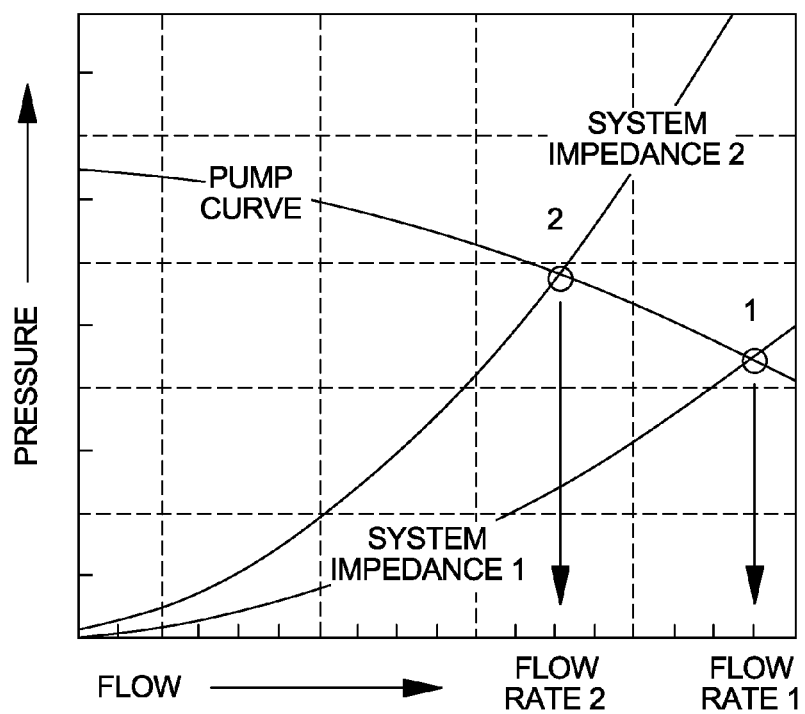
FIG. 12A is an exemplary graph of change in system coolant flow rate through an electronics rack such as depicted in FIG. 11, wherein it is assumed that the coolant pumps within the modular cooling units are maintained at a constant operating RPM level, in accordance with an aspect of the present invention.

FIG. 12A illustrates the effect of adjusting the flow throttling valve of the liquid-cooled electronics rack of FIG. 11. In this example, a partial closing of the flow throttling valve results in the flow rate transitioning from flow rate 1 to flow rate 2 along the pump curve, which assumes that the RPMs of the modular cooling unit(s) supplying the liquid-cooled electronics rack remain constant. As shown, this causes the system pressure drop characteristics to change, moving along the operating pump curve from system impedance 1 to system impedance 2, thereby decreasing the overall system flow rate and increasing the pressure level throughout the piping network. A significant power reduction and energy savings can be achieved by dynamically reducing pump speed as the overall system flow impedance increases. The cooling system and method disclosed herein accomplish this by simultaneously, but independently, controlling flow rate through the individual liquid-cooled electronics racks, and pressure in the piping supply network, e.g., at the outputs of the modular cooling units.

Figure 12B:
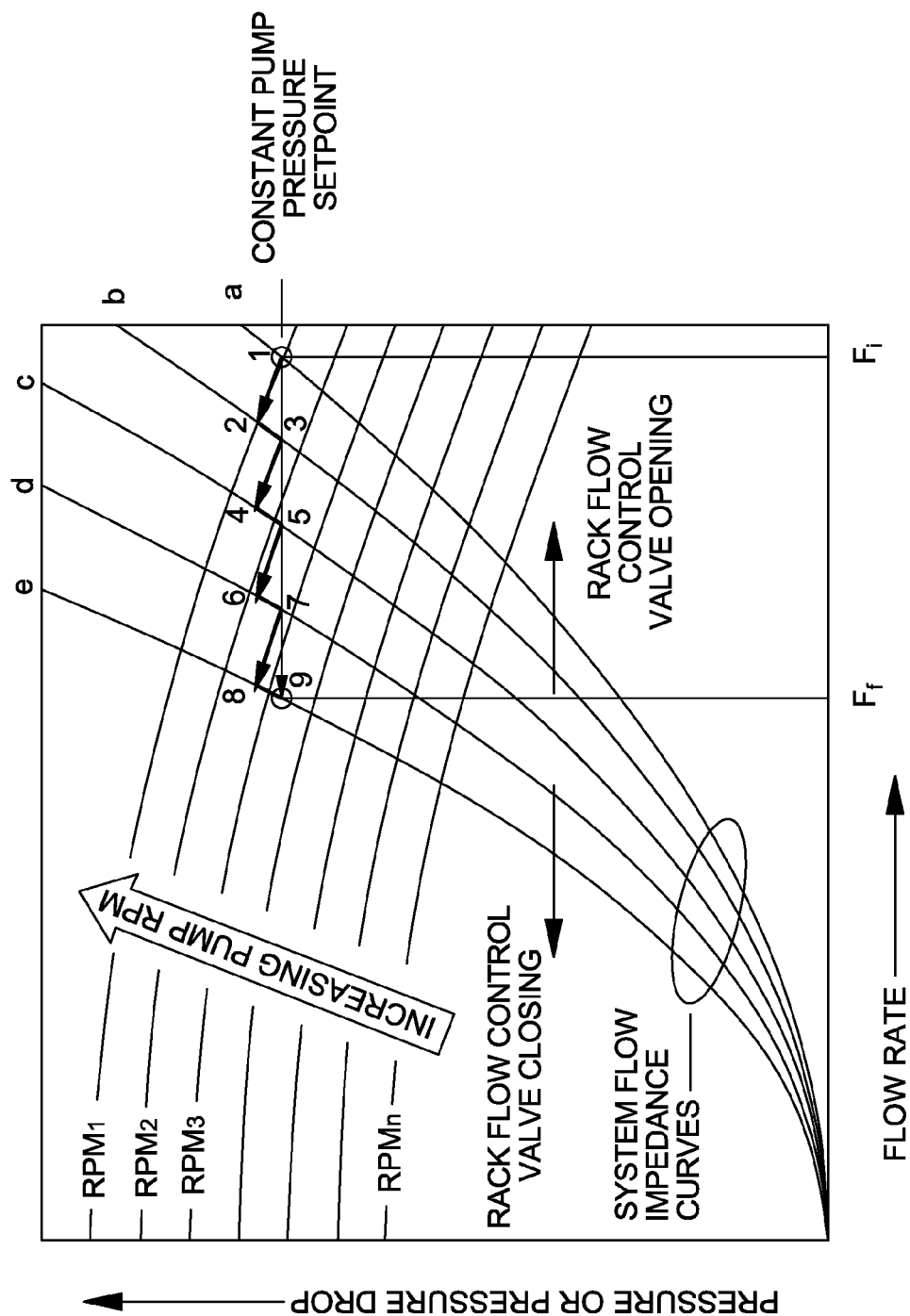
FIG. 12B is a graph illustrating pressure drop versus flow rate for incremental adjustments in overall system coolant flow rate through a liquid-cooled electronics rack(s) and commensurate incremental adjustments in pumping RPMs of the modular cooling unit(s), assuming pressure is to be maintained within a range about a constant coolant pressure set point at the output of the modular cooling unit(s), in accordance with an aspect of the present invention.

FIG. 12B is provided to illustrate the interaction between the coolant flow controller at the liquid-cooled electronics rack level, and the coolant pressure controller(s) for the outputs of the modular cooling units. Depicted in FIG. 12B are: (1) a series of pump performance curves in terms of pressure versus flow rate for various pump speeds (i.e., RPMs), and (2) a series of system flow impedance curves with the associated rack-valve pressure drop versus coolant flow rate through the rack for various flow throttling valve openings (denoted as a-e). For simplicity of discussion, a single electronics rack and a single modular cooling unit are assumed.

The intersection of the system flow impedance curve for any given valve opening and the pump performance curve for a given pump speed establishes the cooling system operating point in terms of the pump output pressure at the modular cooling unit and system coolant flow rate at the rack level. By way of example, for a higher electronics rack heat load, the specified rack component temperatures might require the flow rate valve to be more towards a full open position (a) and the adjustable coolant pump(s) to be operated at a higher speed (RPM1), establishing initial operating point 1, and coolant flow rate $F_i$. If rack heat load decreases, a lower flow rate, $F_f$, will be required to maintain the component(s) (e.g., the designated critical component(s)) at their original specified operating temperature (or within their specified temperature range). As component temperatures start to decrease, the rack coolant flow controller begins to close the flow control valve, turning at each step the valve towards the closed position by an incremental amount, $\theta°$. At constant pump speed (RPMs), this action causes the flow impedance curve to shift from (a) to (b), and pump output pressure to increase, establishing system operating point 2 at a flow rate below the initial flow rate. The pump pressure controller in the modular cooling unit(s) responds to this change by reducing the pump speed by an incremental amount, $\Delta RPM$ (i.e., to a speed between RPM1 and RPM2), which reduces the pump output pressure to the selected pressure set point following flow impedance curve (b) to operating point 3. Because this operating point is still above the desired flow rate $F_f$ for the new heat load, the component temperatures will be lower than specified and the rack coolant flow controller will close the flow control valve by an additional incremental amount, $\theta°$. At constant pump RPMs, this action causes the flow impedance curve to shift to curve (c) and the pump output pressure to again increase establishing system operating point 4 at a lower flow rate. The pump pressure controller in the modular cooling unit(s) responds to this change by reducing the pump speed by a further incremental amount $\Delta RPM$ (i.e., to a speed between RPM2 and RPM3), again reducing pump output pressure to the pressure set point following flow impedance curve (c) to operating point 5.

This sequence of steps, cycling back and forth between flow and pressure adjustments, continues until operating point 9 is reached, at which point the required system coolant flow rate to maintain the designated critical component temperature within its specified operating temperature range is attained. It should be noted that although in this example a single liquid-cooled electronics rack and a single modular cooling unit are discussed, a multiplicity of liquid-cooled electronics racks (with the same or different heat loads), and a multiplicity of modular cooling units may act in concert in a typical data center implementation to produce a similar result. It should also be noted that, as the incremental changes in flow rate, position and pump speed are made smaller, the "saw-tooth" behavior (or oscillations in pump pressure) will become smaller and the transition from state "1" to state "9" in FIG. 12B will more nearly approach a straight line. In addition, the dynamic operation of the two control systems (i.e., flow and pressure control) will become more nearly simultaneous in action.

Although one object of the cooling system and method disclosed herein is to provide rack-level component temperature control through flow and pressure control, a further object is to minimize the pumping power required for the cooling function. This invention does so by actively reducing the pump speed to the minimum RPMs necessary to achieve a required overall system coolant flow rate. As is well known, for a given centrifugal pump, the power to drive the pump varies with the cube of its speed. So, the percent reduction in power required to drive a pump by reducing pump speed from RPM1 to RPM2 is given by Equation (1) below:

$$\% \text{ power reduction} = \left(1 - \left(\frac{RPM2}{RPM1}\right)^3\right) \times 100 \qquad (1)$$

If, for example, RPM1 is 4200 and RPM2 is 3850, then:

$$\% \text{ power reduction} = \left(1 - \left(\frac{3850}{4200}\right)^3\right) \times 100 = 23 \qquad (2)$$

In this example, the reduction in speed results in a 23% reduction in the power required to drive the pumps.

Figure 13A:
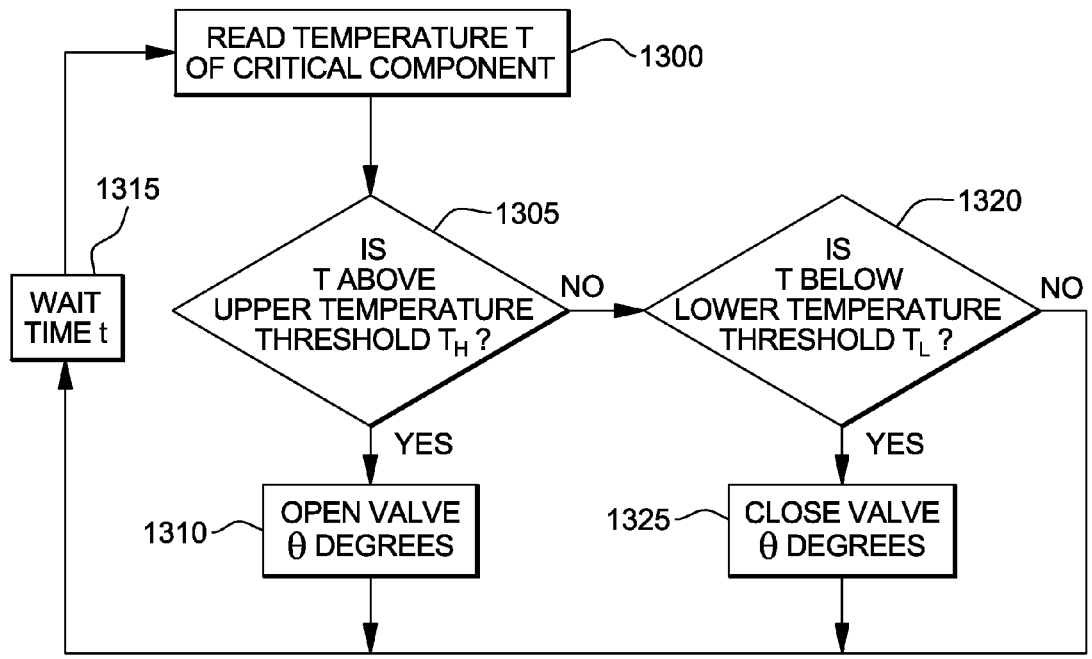
FIG. 13A depicts one embodiment of logic for controlling system coolant flow rate through a liquid-cooled electronics rack based on monitored temperature of at least one component of the liquid-cooled electronics rack, in accordance with an aspect of the present invention.

FIG. 13A depicts one embodiment of logic for controlling system coolant flow through a liquid-cooled electronics rack. It is assumed that one or more modular cooling units are provided with a pump (or pumps) of sufficient capacity to ensure that enough system coolant flow can be delivered to all of the liquid-cooled electronics rack under maximum load conditions. Thus, as rack workload and thermal dissipation vary, the flow control valve within each electronics rack opens and closes independently of the other racks to satisfy its individual rack cooling flow needs.

In the example of FIG. 13A, this flow control is based on the temperature T of one or more designated critical components within the respective electronics rack. The logic initially reads a temperature T associated with the one or more designated critical components 1300, and a determination is made whether temperature T is above a defined upper temperature threshold $T_H$ 1305. If "yes", then the rack's flow control valve is opened by a set amount, e.g., by $\theta°$ 1310. The logic then waits a time interval t 1315 before again reading the temperature T associated with the designated critical component(s) 1300. If the temperature T associated with the designated critical component(s) is not above the upper temperature threshold $T_H$ (i.e., the upper operating temperature set point), then the logic determines whether temperature T is below a lower temperature threshold $T_L$ 1320 (i.e., the lower operating temperature set point). If "yes", then the flow control valve is closed by a set amount, for example, by $\theta°$ 1325, after which the logic waits a defined time interval t 1315 before reading a next temperature T associated with the designated critical component(s) 1300.

Figure 13B:
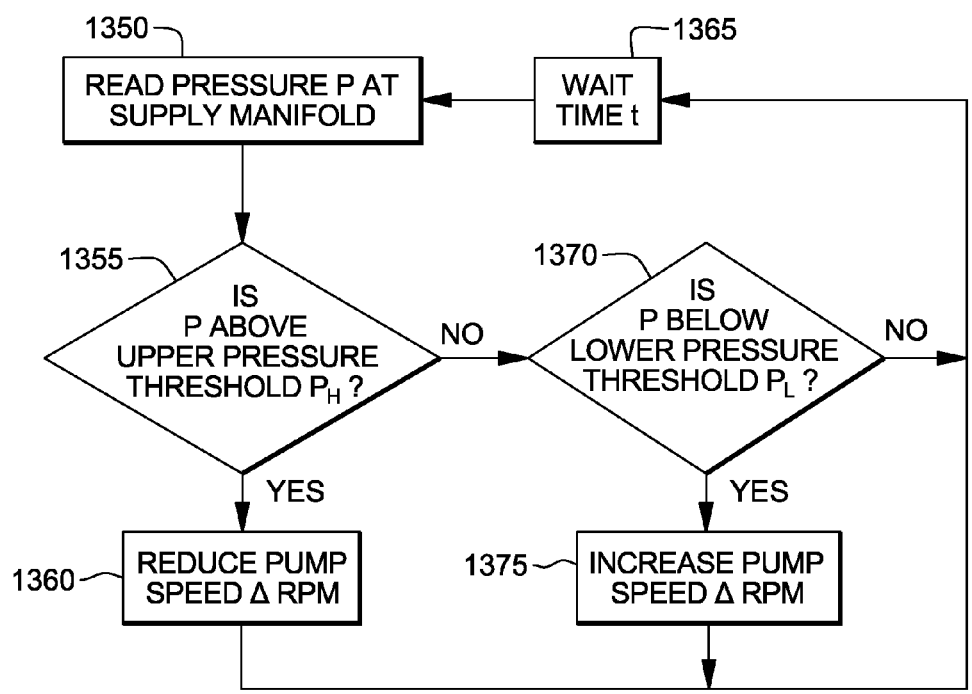
FIG. 13B depicts one embodiment of logic for adjusting pump speed of an adjustable coolant pump within a modular cooling unit to maintain system coolant pressure at the output of the modular cooling unit within a specified pressure range about a desired, constant coolant pressure, in accordance with an aspect of the present invention.

FIG. 13B depicts one embodiment of pressure control logic for a modular cooling unit supplying one or more liquid-cooled electronics racks, as described above. As the flow control valves in the individual electronics racks open and close, the total system flow (i.e., the overall system coolant flow) will vary up or down, respectively. As flow decreases, the pressure in the supply lines tends to rise, and as flow increases, the pressure in the supply lines tends to decrease. In accordance with the present invention, a change in pressure within the system coolant supply manifold, i.e., at the outputs of the modular cooling units, is sensed and the speed (i.e., RPMs) of each adjustable coolant pump is adjusted accordingly to maintain coolant pressure within a range about a constant pressure set point at the outputs of the modular cooling units. This means that for any heat load condition below a maximum design load, the pump speeds will be reduced, resulting in a reduction of the amount of electrical power required to drive the pumps.

Referring to FIG. 13B, the pressure control logic reads pressure P at the output of the respective modular cooling unit (e.g., at the supply manifold) 1350, and determines whether pressure P is above a defined upper pressure threshold $P_H$ 1355. If "yes", then the pump speed is reduced by ΔRPMs 1360, after which the logic waits a predefined time interval t 1365 before again reading pressure P at the output of the respective modular cooling unit 1350. If pressure P is below the upper pressure threshold $P_H$, then the logic determines whether pressure P is below a defined lower pressure threshold $P_L$ 1370. If "yes", then the pump speed is increased by ΔRPMs 1375, after which the logic waits predefined time interval t 1365 before again reading pressure P at the output of the modular cooling unit 1350.

Figure 14A:
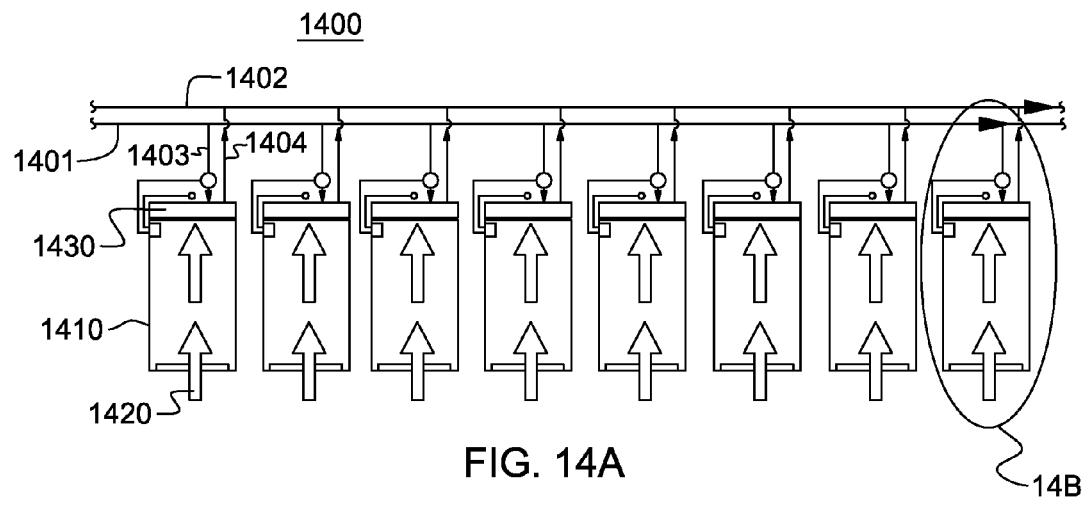
FIG. 14A is a schematic of a data center comprising multiple air-cooled electronics racks with liquid-cooled heat exchangers positioned at the air outlet sides thereof, in accordance with an aspect of the present invention.
Figure 14B:
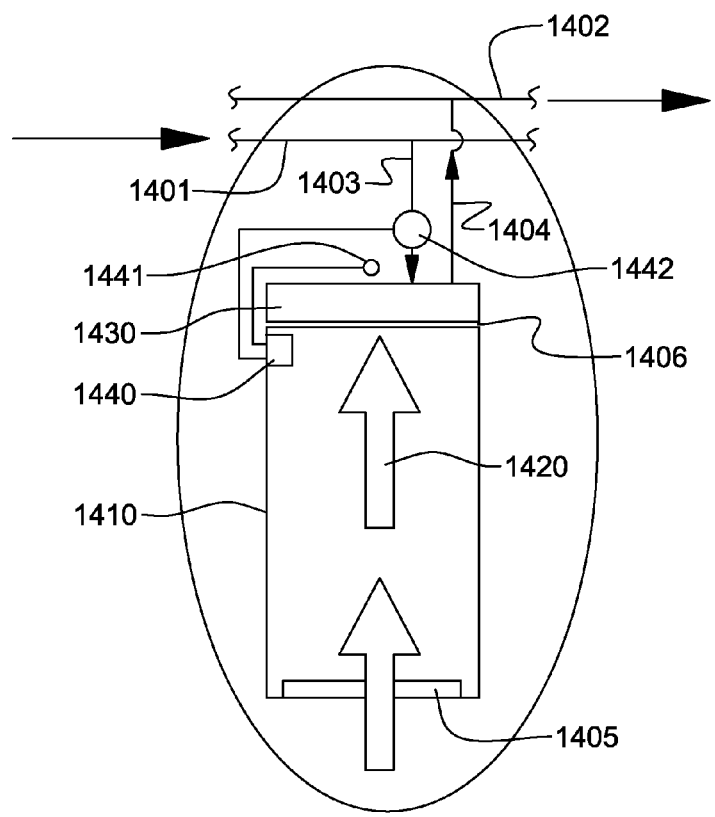
FIG. 14B is a partial enlargement of one air-cooled electronics rack and liquid-cooled heat exchanger assembly depicted in the data center configuration of FIG. 14A, in accordance with an aspect of the present invention.

Those skilled in the art will note from the above discussion that numerous variations to the concepts described herein are possible. FIGS. 14A & 14B depict one such variation. In FIGS. 14A & 14B, the above-described (dual mode) flow and pressure control approach to providing individual temperature control to multiple liquid-cooled electronics racks while minimizing pumping power needed to deliver the requisite coolant flow is used to control system coolant flow to, for example, multiple rear door heat exchangers associated with a plurality of otherwise air-cooled electronics racks. Rack-level cooling of air flow through air-cooled electronics racks is described, for example, in commonly assigned, U.S. Pat. No. 7,385,810 B2 and U.S. Pat. No. 7,477,514 B2.

Referring collectively to FIGS. 14A & 14B, a data center 1400 is illustrated wherein a plurality of air-cooled electronics racks 1410 are aligned in a row. As shown, air flow 1420 ingresses through an air inlet side 1405 of the air-cooled electronics racks 1410 and egresses through an air outlet side 1406 thereof. Disposed at the air outlet side of each electronics rack is a rear door heat exchanger 1430, which is mounted, for example, to the electronics rack itself or to a door of the electronics rack at the air outlet side thereof Within each rear door heat exchanger is an air-to-liquid heat exchanger through which system coolant flows and across which exhausted air from the air outlet side of the electronics rack passes.

A system coolant supply branch line 1401 and a rack-level coolant branch line 1403 supply cooled system coolant to rear door heat exchanger 1430 within each electronics rack 1410, and exhausted system coolant is returned via rack-level coolant branch lines 1404 and system coolant return branch line 1402. In one embodiment, system coolant supply branch line 1401 is in fluid communication at its ends with a main system coolant supply loop, and system coolant return branch line 1402 is in fluid communication at its ends with a main system coolant return loop, as described above. A rack-level coolant flow controller 1440 is provided for each electronics rack 1410 and is coupled to one or more temperature sensors 1441 associated with the rear door heat exchanger for sensing temperature of air passing across the heat exchanger, and to a flow control valve 1442 in fluid communication with rack-level coolant branch line 1403. In one variation, an array of temperature sensors is provided within the air exhaust stream, either before or after the air-to-liquid heat exchanger.

One or more temperature signals is sent back to the flow controller which contains (for example) a control card with the necessary logic to implement system flow control, as described herein. If temperature of the exhaust air is above an upper-specified exhaust air set point temperature, then the flow controller incrementally opens the flow control valve to allow more system coolant to flow through the rear door heat exchanger, thereby further cooling the air. Conversely, if the temperature of the exhaust air is below a lower-specified exhaust air set point temperature, then the flow controller incrementally closes the flow control valve to allow less system coolant to flow through the rear door heat exchanger. The system coolant pressure sensing and pump speed control at the modular cooling units would be the same as described above.

Further details and variations of liquid-based cooling apparatuses and methods for cooling electronics systems and/or electronics racks are disclosed in co-filed U.S. patent application Ser. No. 12/556,019, published Mar. 10, 2001, as U.S. Pat. Publication No. 2011/0058637 A1, entitled "Pressure Control Unit and Method Facilitating Single-Phase Heat Transfer in a Cooling System" , and co-filed U.S. patent application Ser. No. 12/556,031, published Mar. 10, 2001, as U.S. Pat. Publication No. 2011/0056225 A1, entitled "Control of System Coolant to Facilitate Two-Phase Heat Transfer in a Multi-Evaporator Cooling System", and co-filed U.S. patent application Ser. No. 12/556,053, published Mar. 10, 2001, as U.S. Pat. Publication No. 2011/0056674 A1, entitled "System and Method for Facilitating Parallel Cooling of Liquid-Cooled Electronics Racks", and co-filed U.S. patent application Ser. No. 12/556,040, published published Mar. 10, 2001, as U.S. Pat. Publication No. 2011/0056675 A1, entitled "Apparatus and Method for Adjusting Coolant Flow Resistance Through Liquid-Cooled Electronics Rack(s)", the entirety of each of which is hereby incorporated herein by reference.

As will be appreciated by one skilled in the art, aspects of the controller described above may be embodied as a system, method or computer program product. Accordingly, aspects of the controller may take the form of an entirely hardware embodiment, an entirely software embodiment (including firmware, resident software, micro-code, etc.) or an embodiment combining software and hardware aspects that may all generally be referred to herein as a "circuit", "module" or "system". Furthermore, aspects of the controller may take the form of a computer program product embodied in one or more computer readable medium(s) having computer readable program code embodied thereon.

Any combination of one or more computer readable medium(s) may be utilized. The computer readable medium may be a computer readable storage medium. A computer readable storage medium may be, for example, but not limited to, an electronic, magnetic, optical, or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electromagnetic, optical, or any suitable combination thereof. A computer-readable signal medium may be any computer-readable medium that is not a computer-readable storage medium and that can communicate, propagate, or transport a program for use by or in connection with an instruction execution system, apparatus or device.

Program code embodied on a computer readable medium may be transmitted using an appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language, such as Java, Smalltalk, C++ or the like, and conventional procedural programming languages, such as the "C" programming language or similar programming languages.

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowcharts or block diagrams may represent a module, segment, or portion of code, which comprises one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Although embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A cooling system comprising:
   a system coolant supply and a system coolant return, the system coolant supply comprising a first loop and the system coolant return comprising a second loop, the first loop of the system coolant supply being separate from the second loop of the system coolant return;
   at least one coolant flow controller associated with a plurality of liquid-cooled electronics systems to be cooled, a coolant flow controller of the at least one coolant flow controller adjusting flow of system coolant through a respective liquid-cooled electronics system of the plurality of liquid-cooled electronics systems, from the first loop of the system coolant supply to the separate second loop of the system coolant return, based on changing cooling requirements of that respective liquid-cooled electronics system;
   a plurality of modular cooling units distributed around, and coupled in fluid communication with, the first loop of the system coolant supply, and distributed around, and coupled in fluid communication with, the separate second loop of the system coolant return, the distribution of the plurality of modular cooling units around the first loop and the separate second loop facilitating reduction in average coolant flow path length from the plurality of modular cooling units to the plurality of liquid-cooled electronics systems, and the plurality of modular cooling units supplying system coolant to the first loop and comprising a plurality of adjustable coolant pumps in fluid communication with and facilitating supply of system coolant to the first loop;
   a plurality of pressure controllers associated with the plurality of modular cooling units for adjusting pressure of system coolant output from the plurality of modular cooling units, where coupled to the first loop, via control of pump speed of the at least one adjustable coolant pump thereof; and
   wherein responsive to adjusting flow of system coolant through the plurality of liquid-cooled electronics systems by the at least one coolant flow controller, the plurality of pressure controllers automatically adjust pump speed of the plurality of adjustable coolant pumps to maintain coolant pressure at the outputs of the plurality of modular cooling units within a range about a constant coolant pressure set point for coolant within the first loop, and wherein a decrease in system coolant flow rate through the plurality of liquid-cooled electronics systems automatically results in the plurality of pressure controllers decreasing pump speed of the plurality of adjustable coolant pumps, thereby reducing power consumption of the plurality of adjustable coolant pumps in cooling the plurality of liquid-cooled electronics systems.

2. The cooling system of claim 1, further comprising at least one temperature monitor, one temperature monitor of the at least one temperature monitor monitoring a temperature associated with at least one component of the respective liquid-cooled electronics system of the plurality of liquid-cooled electronics systems, and wherein the coolant flow controller adjusts flow of system coolant through the respective liquid-cooled electronics system based on monitored temperature associated with that liquid-cooled electronics system, and wherein the cooling system further comprises at least one pressure sensor for sensing pressure of system coolant output from the plurality of modular cooling units, the plurality of pressure controllers employing sensed system coolant pressure in determining whether to automatically adjust pump speed of the plurality of adjustable coolant pumps.

3. The cooling system of claim 2, wherein the one temperature monitor of the at least one temperature monitor monitors temperature associated with at least one designated critical component to be cooled of the respective liquid-cooled electronics system, the at least one designated critical component being at least one component of a plurality of components of that liquid-cooled electronics system.

4. The cooling system of claim 2, wherein the plurality of liquid-cooled electronics systems is air cooled by an air flow passing therethrough from air inlet side(s) to air outlet side(s) thereof, and wherein the at least one temperature monitor monitors temperature of exhaust air at the air outlet side(s) of the plurality of liquid-cooled electronics systems, and the plurality of liquid-cooled electronics systems comprise at least one heat exchange assembly coupled to the air outlet side(s) thereof, the at least one heat exchange assembly comprising an air-to-liquid heat exchanger through which system coolant flows from the system coolant supply to the system coolant return.

5. The cooling system of claim 1, wherein the at least one coolant flow controller transitions the plurality of liquid-cooled electronics system to be cooled from a first overall system flow rate to a second overall system flow rate via multiple stepwise changes of system coolant flow through the plurality of liquid-cooled electronics systems, and the plurality of pressure controllers responds to each stepwise change in overall system coolant flow through the plurality of liquid-cooled electronics systems by automatically adjusting pump speed of the plurality of adjustable coolant pumps to maintain coolant pressure at the outputs of the plurality of modular cooling units within the range about the constant coolant pressure set point, wherein a stepwise decrease in overall system coolant flow through the plurality of liquid-cooled electronics systems by the at least one coolant flow controller results in a stepwise decrease in pump speeds of the plurality of system coolant pumps by the plurality of pressure controllers, and a stepwise increase in overall system coolant flow through the plurality of liquid-cooled electronics systems by the at least one coolant flow controller results in a stepwise increase in the pump speeds of the plurality of adjustable system coolant pumps by the plurality of pressure controllers, thereby minimizing power consumption of the plurality of adjustable coolant pumps.

6. The cooling system of claim 1, further comprising at least one temperature monitor, one temperature monitor of the at least one temperature monitor monitoring a temperature associated with at least one component of the respective liquid-cooled electronics system of the plurality of liquid-cooled electronics systems, and wherein a coolant flow controller of the at least one coolant flow controller increases flow of system coolant through the respective liquid-cooled electronics system when monitored temperature associated with the at least one component thereof is above an upper temperature threshold, and decreases flow of system coolant through the respective liquid-cooled electronics system when monitored temperature associated with the at least one component thereof is below a lower temperature threshold.

7. The cooling system of claim 6, wherein a pressure controller of the plurality of pressure controllers decreases pump speed of an adjustable coolant pump of the plurality of adjustable coolant pumps when system coolant pressure at the output(s) of a modular cooling unit of the plurality of modular cooling units, where coupled to the first loop, is above an upper pressure threshold, and increases pump speed of the adjustable coolant pump when system coolant pressure at the output of the modular cooling unit, where coupled to the first loop, is below a lower pressure threshold.

8. The cooling system of claim 1, further comprising:
a plurality of coolant flow controllers associated with the plurality of liquid-cooled electronics systems to be cooled, each coolant flow controller adjusting flow of system coolant through a respective liquid-cooled electronics system, from the first loop to the separate second loop, based on changing cooling requirements of that liquid-cooled electronics system; wherein:
the plurality of modular cooling units coupled in fluid communication with the system coolant supply loop and with the system coolant return loop supply system coolant to the first loop, where each modular cooling unit comprises an adjustable coolant pump for facilitating supply of system coolant in parallel to the first loop;
each pressure controller of the plurality of pressure controllers is associated with a different modular cooling unit of the plurality of modular cooling units and controls pressure of system coolant at an output of the modular cooling unit, where coupled to the first loop, via control of pump speed of an adjustable coolant pump of the modular cooling unit; and
the system coolant supply comprises a system coolant supply manifold and the system coolant return comprises a system coolant return manifold, the system coolant supply manifold being a separate manifold from the system coolant return manifold, the system coolant supply manifold and the separate system coolant return manifold coupling the plurality of modular cooling units in fluid communication with the plurality of liquid-cooled electronics systems, wherein the system coolant supply manifold comprises the first loop and a plurality of system coolant supply branch lines coupled at each end thereof in fluid communication with the first loop and facilitating supply of system coolant to the plurality of liquid-cooled electronics systems, wherein cooled system coolant circulates through the first loop, and wherein the separate system coolant return manifold comprises the separate second loop and a plurality of system coolant return branch lines coupled at each end thereof in fluid communication with the second loop, and facilitating return of exhausted system coolant from the plurality of liquid-cooled electronics systems, wherein exhausted system coolant circulates through the separate second loop.

9. The cooling system of claim 8, wherein one modular cooling unit of the plurality of modular cooling units further comprises a liquid-to-liquid heat exchanger comprising a first coolant path and a second coolant path, the first coolant path being in fluid communication with the separate second loop and the first loop to facilitate passing a portion of exhausted system coolant from the separate second loop through the liquid-to-liquid heat exchanger, and the second coolant path being coupled in fluid communication with a facility coolant supply line and a facility coolant return line to facilitate passing chilled facility coolant through the liquid-to-liquid heat exchanger for cooling exhausted system coolant passing through the first coolant path of the liquid-to-liquid heat exchanger for recirculation thereof to the plurality of liquid-cooled electronics systems as cooled system coolant via the first loop.

10. A data center comprising:
  a plurality of liquid-cooled electronics racks; and
  a cooling system for facilitating liquid cooling of the plurality of liquid-cooled electronics racks, the cooling system comprising:
    a system coolant supply and a system coolant return, the system coolant supply comprising a first loop and the system coolant return comprising a second loop, the first loop of the system coolant supply being separate from the second loop of the system coolant return;
    a plurality of coolant flow controllers associated with the plurality of liquid-cooled electronics racks, one coolant flow controller of the plurality of coolant flow controllers adjusting flow of system coolant through a respective liquid-cooled electronics rack, from the first loop of the system coolant supply to the second loop of the system coolant return, based on changing cooling requirements of that respective liquid-cooled electronics rack;
    a plurality of modular cooling units distributed around, and coupled in fluid communication with, the first loop of the system coolant supply, and distributed around, and coupled in fluid communication with, the separate second loop of the system coolant return, the distribution of the plurality of modular cooling units around the first loop and the separate second loop facilitating reduction in average coolant flow path length from the plurality of modular cooling units to the plurality of liquid-cooled electronics racks, and the plurality of modular cooling units supplying cooled system coolant to the first loop, and comprising a plurality of adjustable coolant pumps for facilitating supply of cooled system coolant in parallel to the first loop;
    a plurality of pressure controllers, one pressure controller of the plurality of pressure controllers being associated with a respective modular cooling unit of the plurality of modular cooling units and controlling pressure of system coolant at an output of that modular cooling unit, where coupled to the first loop, via control of pump speed of an adjustable coolant pump thereof of the plurality of adjustable coolant pumps; and
    wherein responsive to an adjusting flow of system coolant through the plurality of liquid-cooled electronics racks by the plurality of coolant flow controllers, the plurality of coolant pressure controllers automatically adjust pump speeds of the adjustable coolant pumps to maintain coolant pressure at the outputs of the plurality of modular cooling units within a range about a constant coolant pressure set point for coolant within the first loop, and wherein a decrease in system coolant flow rate through the plurality of liquid-cooled electronics racks automatically results in the plurality of pressure controllers decreasing pump speeds of the adjustable coolant pumps, thereby reducing power consumption of the plurality of adjustable coolant pumps in cooling the plurality of liquid-cooled electronics racks.

11. The data center of claim 10, further comprising a plurality of temperature monitors, one temperature monitor monitoring temperature associated with at least one component of the respective liquid-cooled electronics rack of the plurality of liquid-cooled electronics racks, and wherein the one coolant flow controller adjusts flow of system coolant through the respective liquid-cooled electronics rack based on a monitored temperature associated with that liquid-cooled electronics rack, and wherein the cooling system further comprises at least one pressure sensor for sensing pressure of system coolant at the output of the plurality of modular cooling units, the plurality of pressure controllers employing sensed system coolant pressure in determining whether to automatically adjust pump speeds of the adjustable coolant pumps.

12. The data center of claim 11, wherein the one temperature monitor of the plurality of temperature monitors senses temperature associated with at least one designated critical component to be cooled of the respective liquid-cooled electronics rack, the at least one designated critical component to be cooled being at least one component of a plurality of components of the liquid-cooled electronics rack.

13. The data center of claim 11, wherein the plurality of liquid-cooled electronics racks are air-cooled by an air flow passing therethrough from air inlet sides to an air outlet sides thereof, and wherein the plurality of temperature monitors monitor temperature of exhaust air at the air outlet sides of the plurality of electronics racks, and one liquid-cooled electronics rack of the plurality of liquid-cooled electronics racks comprises a heat exchange assembly mounted to the liquid-cooled electronics rack at the air outlet side thereof, the heat exchange assembly comprising an air-to-liquid heat exchanger through which system coolant flows from the system coolant supply to the system coolant return.

14. The data center of claim 10, wherein the plurality of coolant flow controllers transition the plurality of liquid-cooled electronics racks from a first overall system flow rate to a second overall system flow rate via multiple stepwise changes of system coolant flow through the plurality of liquid-cooled electronics racks, and the plurality of pressure controllers respond to each stepwise change in system coolant flow through the plurality of liquid-cooled electronics racks by automatically adjusting pump speed of the plurality of adjustable system coolant pumps to maintain output coolant pressure of the plurality of modular cooling units at the first loop within the range about the constant coolant pressure set point, wherein a stepwise decrease in overall system coolant flow through the plurality of liquid-cooled electronics racks results in a stepwise decrease in pump speeds of the plurality of adjustable coolant pumps, and a stepwise increase in overall system coolant flow through the plurality of liquid-cooled electronics racks results in a stepwise increase in pumps speeds of the plurality of adjustable coolant pumps, thereby minimizing power consumption of the adjustable coolant pumps.

15. The data center of claim 10, further comprising a plurality of temperature monitors, one temperature monitor of the plurality of temperature monitors monitoring a temperature associated with at least one component of the respective liquid-cooled electronics rack of the plurality of liquid-cooled electronics racks, and wherein the one coolant flow controller of the plurality of coolant flow controllers increases flow of system coolant through the respective liquid-cooled electronics rack when monitored temperature associated with the at least one component thereof is above an upper temperature threshold, and decreases flow of system coolant through the respective liquid-cooled electronics rack when monitored temperature associated with the at least one component thereof is below a lower temperature threshold.

16. The data center of claim 15, wherein a pressure controller of the plurality of pressure controllers decreases pump speed of an associated adjustable coolant pump of the plurality of adjustable coolant pumps when system coolant pressure at the output of the respective modular cooling unit, where coupled to the first loop, is above an upper pressure threshold and increases pump speed of the associated adjustable coolant pump when system coolant pressure at the output of the respective modular cooling unit, where coupled to the first loop, is below a lower pressure threshold.

17. A method comprising:
providing a system coolant supply and a system coolant return, the system coolant supply comprising a first loop, and the system coolant return comprising a second loop, the first loop of the system coolant supply being separate from the second loop of the system coolant return;
supplying system coolant from a plurality of modular cooling units via the first loop to a plurality of liquid-cooled electronics systems to be cooled, the plurality of modular cooling units distributed around, and coupled in fluid communication with, the first loop of the system coolant supply, and distributed around, and coupled in fluid communication with, the separate second loop of the system coolant return, the distribution of the plurality of modular cooling units around the first loop and the separate second loop facilitating reduction in average coolant flow path length from the plurality of modular cooling units to the plurality of liquid-cooled electronics systems, and the plurality of modular cooling unit comprising a plurality of adjustable coolant pumps facilitating supply of system coolant in parallel to the first loop;
dynamically adjusting flow of system coolant through the plurality of liquid-cooled electronics systems based on changing cooling requirements thereof;
automatically adjusting system coolant pressure at an output of at least one modular cooling unit of the plurality of modular cooling units, where coupled in fluid communication with the first loop, via control of pump speed of at least one adjustable coolant pump thereof; and
wherein responsive to the dynamically adjusting flow of system coolant through the plurality of liquid-cooled electronics systems, the automatically adjusting pressure comprises automatically adjusting pump speed of the at least one adjustable coolant pump to maintain coolant pressure at the output of the at least one modular cooling unit within a range about a constant coolant pressure set point for coolant within the first loop, and wherein a decrease in system coolant flow rate through the plurality of liquid-cooled electronics systems results in automatically decreasing pump speed of the at least one adjustable coolant pump, thereby reducing power consumption of the at least one adjustable coolant pump in cooling the plurality of liquid-cooled electronics systems.

18. The method of claim 17, further comprising monitoring temperature associated with at least one component of a respective liquid-cooled electronics system of the plurality of liquid-cooled electronics systems, and sensing pressure of system coolant at the output(s) of the plurality of modular cooling units, and wherein the method further comprises dynamically adjusting flow of system coolant through the respective liquid-cooled electronics system based on the monitored temperature associated with the at least one component thereof, and the automatically adjusting system coolant pressure comprises employing sensed system coolant pressure in determining whether to automatically adjust pump speed of the at least one adjustable coolant pump.

19. The method of claim 18, wherein the monitoring temperature further comprises monitoring temperature associated with at least one designated critical component to be cooled of the respective liquid-cooled electronics system, the at least one designated critical component being at least one component of a plurality of components of the respective liquid-cooled electronics system.

20. The method of claim 18, wherein the dynamically adjusting flow of system coolant comprises automatically increasing flow of system coolant through the respective liquid-cooled electronics system when monitored temperature associated with the at least one component thereof is above an upper temperature threshold, and decreasing flow of system coolant through the respective liquid-cooled electronics system when monitored temperature associated with the at least one component thereof is below a lower temperature threshold, and wherein the automatically adjusting system coolant pressure further comprises automatically decreasing pump speed of the at least one adjustable coolant pump when system coolant pressure at the output of the respective at least one modular cooling unit, where coupled to the first loop of the system coolant supply, is above an upper pressure threshold and automatically increasing pump speed of the adjustable coolant pump when system coolant pressure at the output of the respective at least one modular cooling unit is below a lower pressure threshold.

21. The cooling system of claim 10, wherein there are more liquid-cooled electronics racks being liquid-cooled by the cooling system than modular cooling units supplying system coolant to the first loop of the system coolant supply.

22. The cooling system of claim 1, wherein the plurality of modular cooling units are clustered into multiple clusters distributed around the first loop of the system coolant supply and the separate second loop of the system coolant return.

* * * * *